United States Patent
Konishi et al.

(10) Patent No.: US 6,671,002 B1
(45) Date of Patent: Dec. 30, 2003

(54) VSB RECEIVER

(75) Inventors: Takaaki Konishi, Ibaraki (JP); Kazuya Ueda, Suita (JP); Hiroshi Azakami, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/555,150

(22) PCT Filed: Sep. 24, 1999

(86) PCT No.: PCT/JP99/05213

§ 371 (c)(1),
(2), (4) Date: Aug. 7, 2000

(87) PCT Pub. No.: WO00/19673

PCT Pub. Date: Apr. 6, 2000

(30) Foreign Application Priority Data

Sep. 28, 1998 (JP) .......................... 10/273385

(51) Int. Cl.[7] .................................. H04N 5/44
(52) U.S. Cl. .................. 348/725; 375/345; 375/321
(58) Field of Search ................. 348/473, 475, 348/476, 500, 505, 513, 525, 526, 725, 726, 727, 728, 731; 455/204, 150.1, 47; 375/345, 321, 320

(56) References Cited

U.S. PATENT DOCUMENTS

| 5,627,604 | A | * | 5/1997 | Krishnamurthy et al. ... 348/726 |
| 5,673,293 | A | * | 9/1997 | Scarpa et al. ............... 375/321 |
| 5,715,012 | A | * | 2/1998 | Patel et al. .................. 348/555 |
| 5,745,004 | A | * | 4/1998 | Mycynek et al. ........... 329/308 |
| 5,764,309 | A | * | 6/1998 | Krishnamurthy et al. ... 348/678 |
| 5,802,461 | A | * | 9/1998 | Gatherer ...................... 455/204 |
| 5,805,241 | A | * | 9/1998 | Limberg ...................... 348/725 |
| 5,805,242 | A | * | 9/1998 | Strolle et al. ............... 348/726 |
| 5,841,820 | A | * | 11/1998 | Krishnamurthy et al. ... 375/345 |
| 5,955,618 | A | * | 9/1999 | Kim ............................ 348/471 |
| 6,046,775 | A | * | 4/2000 | Jonnalagadda et al. ..... 348/461 |
| 6,069,524 | A | * | 5/2000 | Mycynek et al. ........... 329/308 |
| 6,069,667 | A | * | 5/2000 | Ueda et al. .................. 348/525 |
| 6,133,964 | A | * | 10/2000 | Han ............................ 348/726 |
| 2001/0007480 | A1 | * | 7/2001 | Hong et al. ................. 348/725 |

FOREIGN PATENT DOCUMENTS

| EP | 0785632 | * | 7/1997 |
| JP | 2-1636 | | 1/1990 |
| JP | 5-207078 | | 8/1993 |
| JP | 9-18533 | | 1/1997 |
| JP | 10-271079 | | 10/1998 |

\* cited by examiner

Primary Examiner—Michael H. Lee
(74) Attorney, Agent, or Firm—Wenderoth, Lind & Ponack, L.L.P.

(57) ABSTRACT

The loop gain of an AGC circuit 7 and the loop gain of a clock regenerating circuit 6 are increased (the gain of an amplifier is increased, or the band of a loop filter is widened) until a synchronizing signal (a segment synchronizing signal or a field synchronizing signal) is detected. The loop gain of the AGC circuit 7 and the loop gain of the clock regenerating circuit 6 are decreased (the gain of the amplifier is decreased, or the band of the loop filter is narrowed) after the synchronizing signal is detected.

Consequently, it is possible to make a reduction of a time period required until convergence processing is completed in the AGC circuit and the clock regenerating circuit compatible with an improvement of a ghost disturbance removal performance and accurate clock regeneration.

52 Claims, 22 Drawing Sheets

WHEN CLOCK SIGNAL IS HIGHER THAN CLOCK FREQUENCY OF TRANSMITTED DATA

WHEN CLOCK SIGNAL IS LOWER THAN CLOCK FREQUENCY OF TRANSMITTED DATA

WHEN CLOCK SIGNAL COINCIDES WITH CLOCK FREQUENCY OF TRANSMITTED DATA

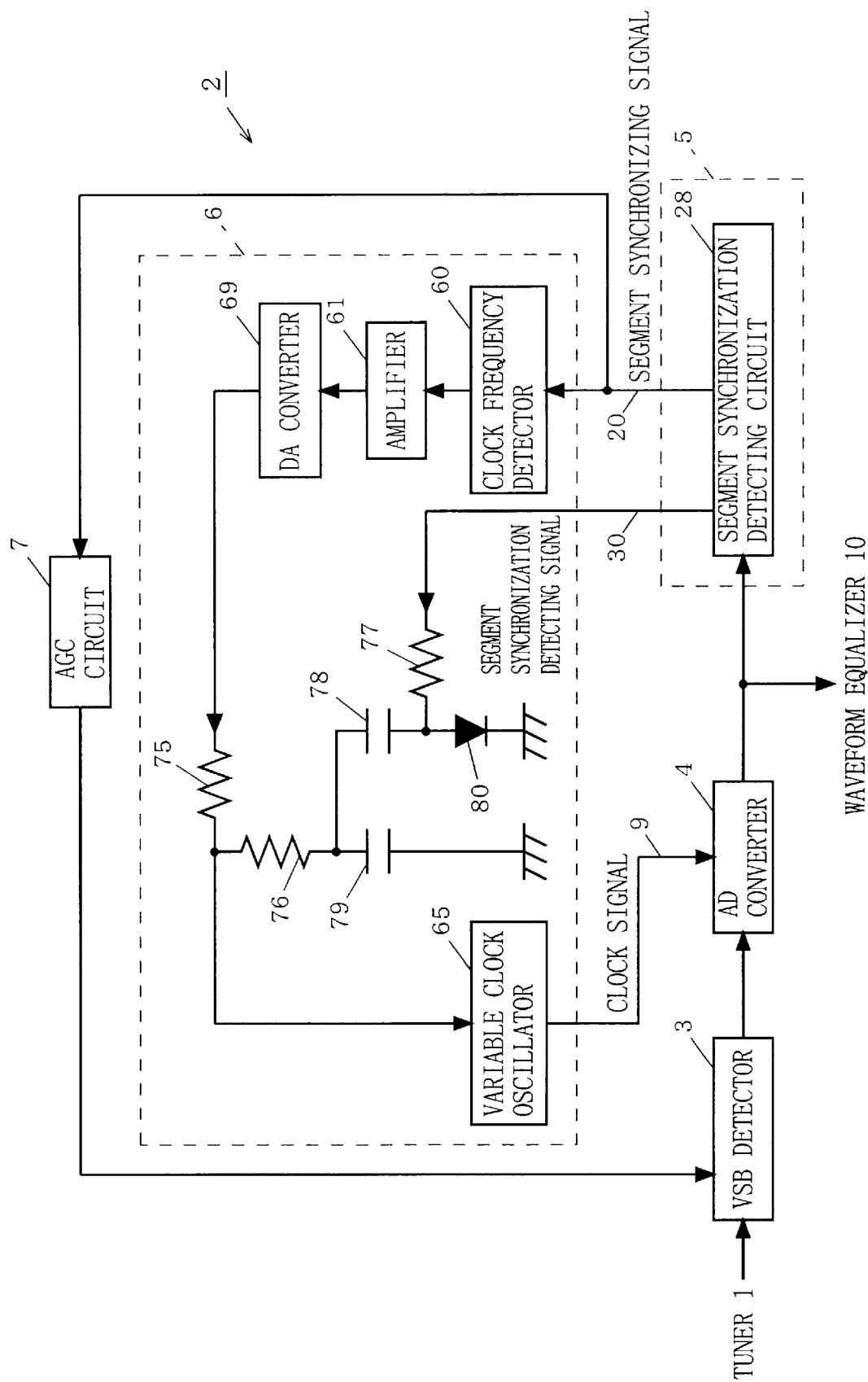

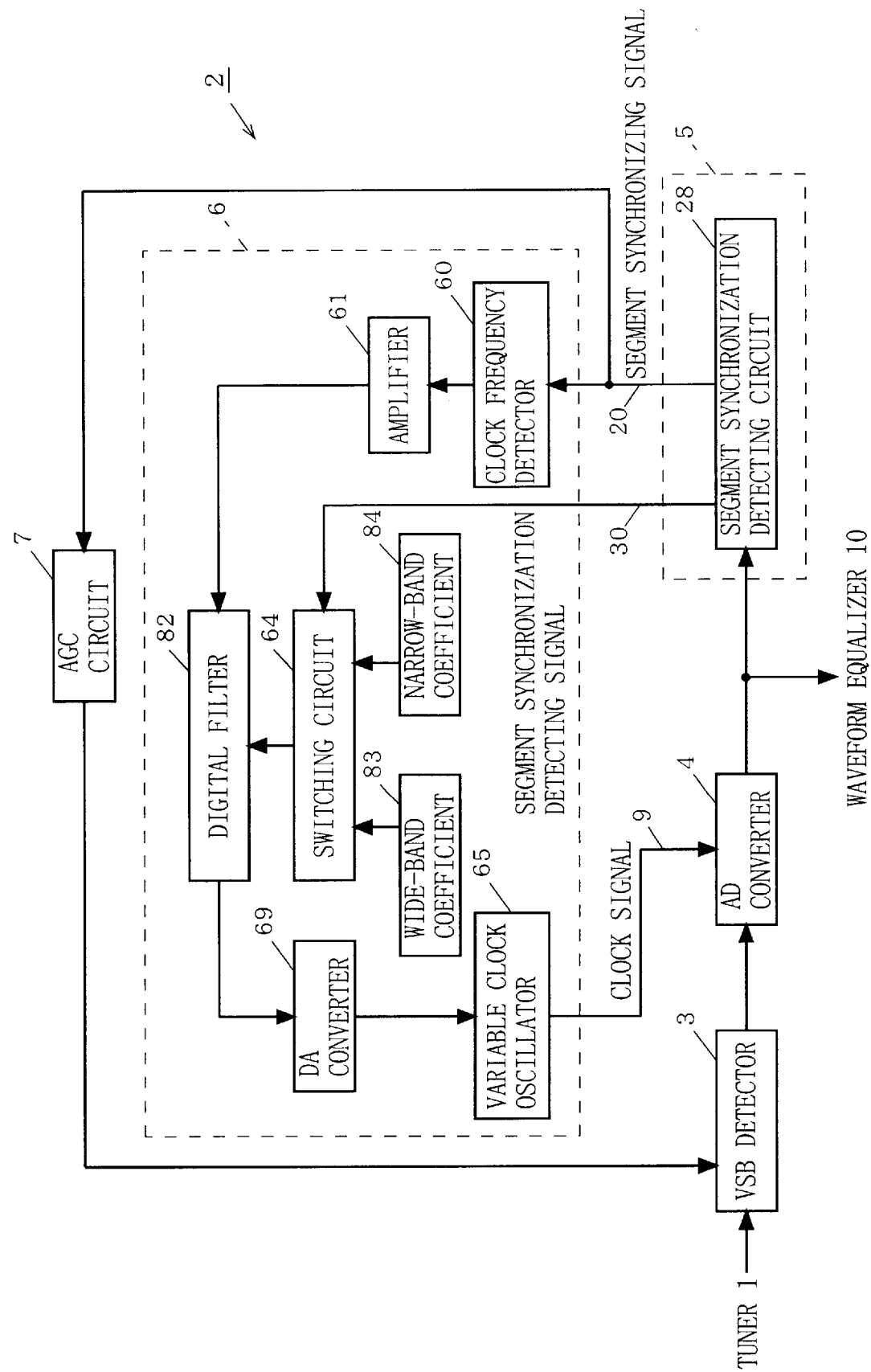

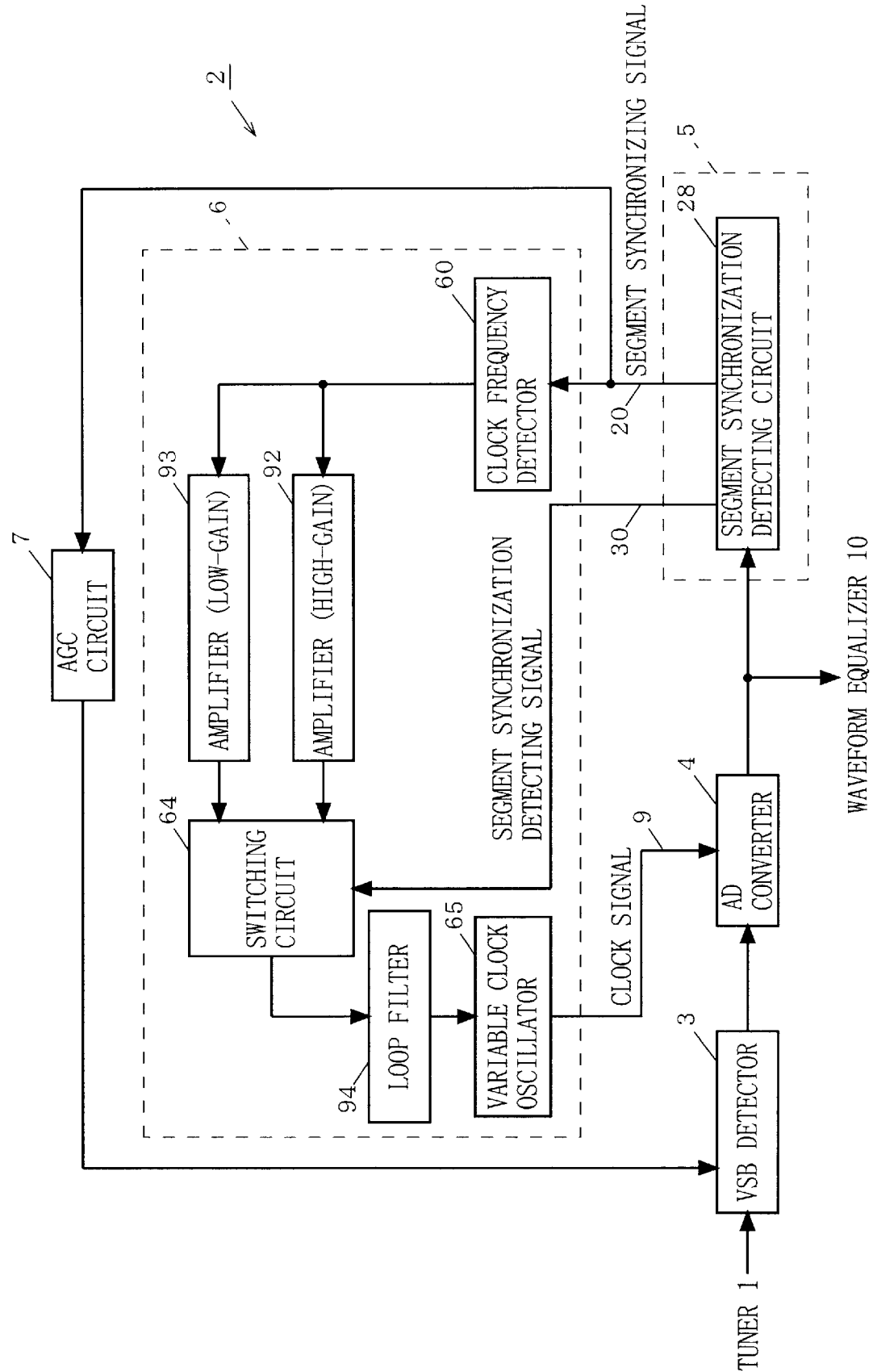

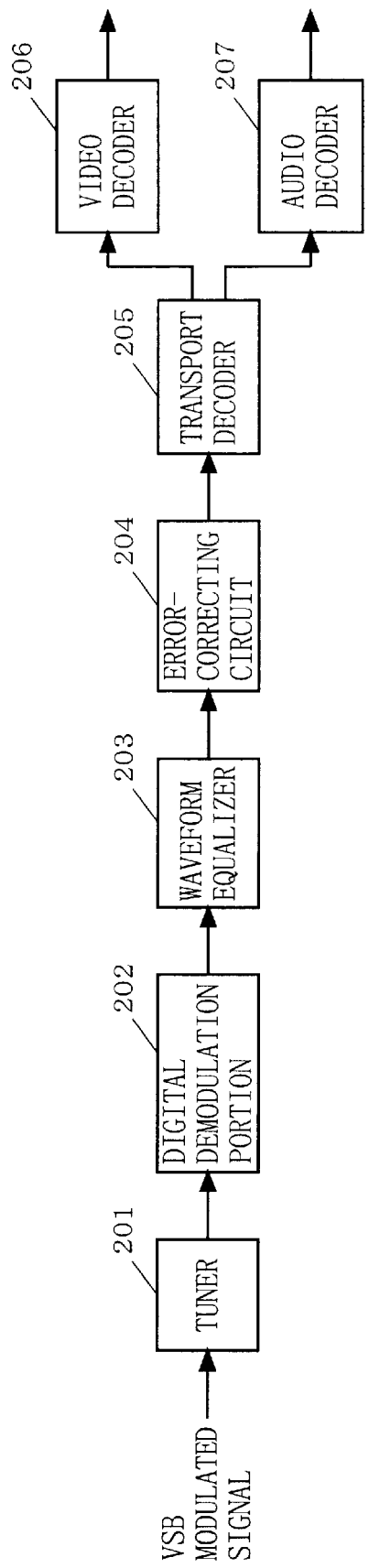
F I G. 2 0

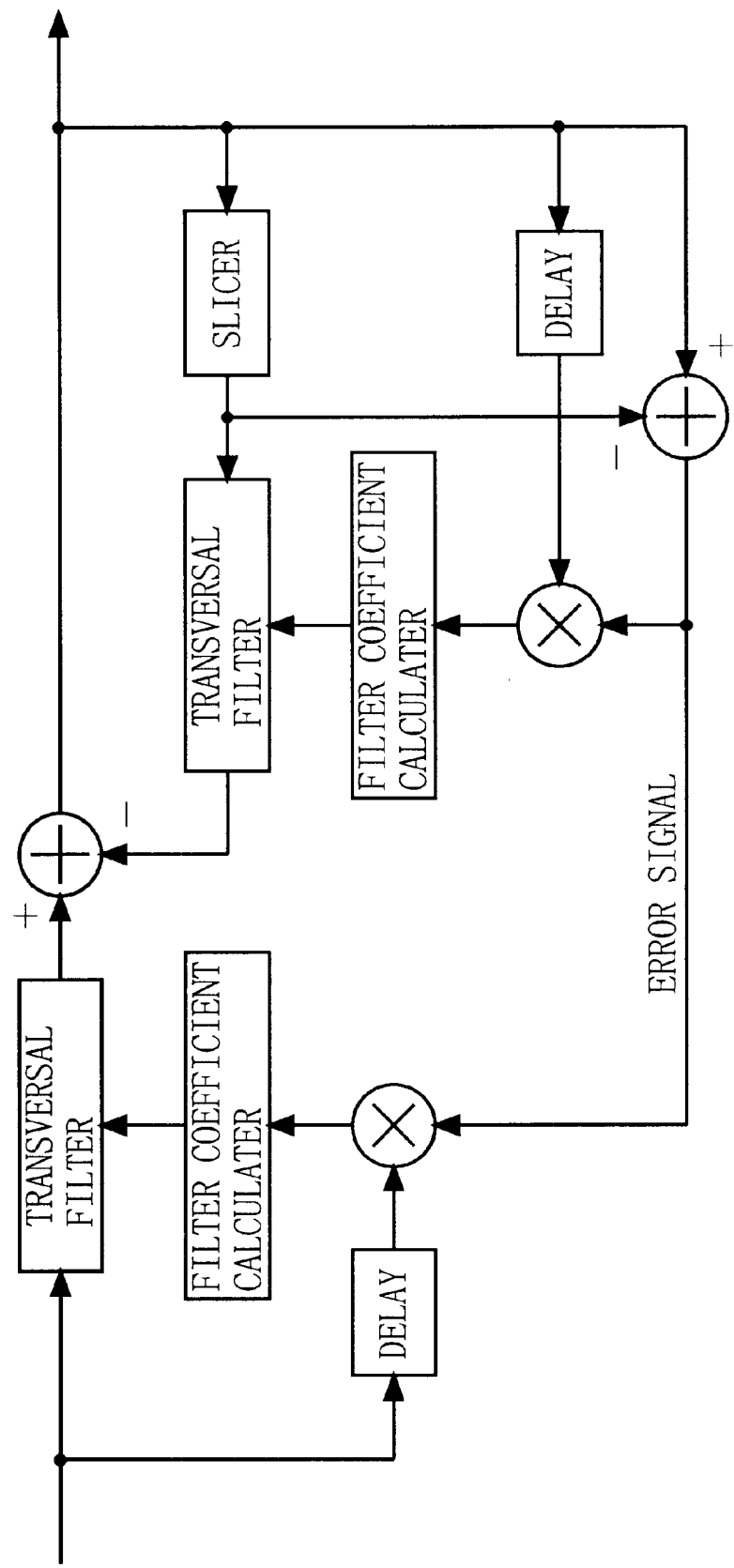
F I G. 21

VSB RECEIVER

TECHNICAL FIELD

The present invention relates to a VSB receiver, and more particularly, to a VSB receiver for receiving a terrestrial digital broadcasting signal which is subjected to vestigial side-band (VSB) modulation and is transmitted.

BACKGROUND ART

In recent years, in the video broadcasting field, the broadcasting form has been changing from an analog form to a digital form in order to provide a high-quality video to a viewer, as is well known. The broadcasting is being digitized with respect to not only broadcasting by a satellite wave which has already been partially put to practical use but also broadcasting by a ground wave. In the United States and Europe, for example, the digitization of broadcasting by a ground wave is being currently put to practical use.

As a digital modulation system used in terrestrial digital broadcasting, various systems have been currently devised. As one of the systems, the ATSC (Advanced Television System Committee) standard for subjecting a signal to multi-valued VSB (octal VSB or hexadecimal VSB) modulation and transmitting the modulated signal has been employed in the United States.

A receiver for receiving the terrestrial digital broadcasting is feasible by being constructed similarly to a receiver basically employed in satellite digital broadcasting or the like, provided that it performs digital demodulation corresponding to digital modulation to which a signal has been subjected. With respect to a receiver for receiving a signal which has been subjected to multi-valued VSB modulation (hereinafter referred to as a VSB receiver), a general configuration is described in a document entitled "GUIDE TO THE USE OF THE ATSC DIGITAL TELEVISION STANDARD (Doc. A/54)" issued by ATSC.

FIG. 20 illustrates an example of the configuration of a VSB receiver described in the above-mentioned document issued by ATSC. In FIG. 20, the VSB receiver described in the document comprises a tuner 201, a digital demodulation portion 202, a waveform equalizer 203, an error-correcting circuit 204, a transport decoder 205, a video decoder 206, and an audio decoder 207.

The tuner 201 receives a signal which has been subjected to VSB modulation. The digital demodulation portion 202 subjects the signal received by the tuner 201 to digital demodulation, and converts the received signal into a digital video signal. The waveform equalizer 203 corrects the distortion or the like of a signal waveform which occurs in a transmission path or the like. The error-correcting circuit 204 subjects the signal waveform whose distortion or the like has been corrected to error correction. The transport decoder 205 separates a video signal and an audio signal which have been transmitted in multiple. The video decoder 206 decodes the separated video signal. The audio decoder 207 decodes the separated audio signal.

It is generally considered that an automatic gain control (hereinafter denoted by an AGC) circuit and a clock regenerating circuit which are indispensable in processing a signal are naturally included as constituent elements in the digital demodulation portion 202, which is not written clearly in the VSB receiver shown in FIG. 20.

The AGC circuit is a circuit whose gain is controlled by a negative feedback loop such that the amplitude of a predetermined reference signal always enters a predetermined level in order to eliminate the effect of the attenuation or the like of a signal on the transmission path, as is well known. Further, the clock regenerating circuit is a circuit whose gain is controlled by a negative feedback loop such that the clock frequency of the received signal and the clock frequency of the receiver coincide with each other (synchronized) in order to regenerate a clock for giving judgment timing of each data (symbol) of a digital signal as is well known.

Each of the AGC circuit and the clock regenerating circuit is operated in order to cause a signal to be controlled to converge into a predetermined value by the negative feedback loop. Accordingly, the loop gain of each of the circuits affects a time period required until the convergence processing is completed, that is, a time period required from the time when a video signal is received until a video is outputted onto a screen. Therefore, the loop gain of each of the AGC circuit and the clock regenerating circuit is fixed to a most suitable value previously determined at which the convergence processing is performed at high speed and accurately.

Meanwhile, the terrestrial digital broadcasting differs from satellite digital broadcasting in that it is necessary to consider that a ghost disturbance is created in the transmission path. Against the ghost disturbance, it is considered that in the above-mentioned VSB receiver, the effect of a ghost can be removed in the processing in the waveform equalizer 203.

When it is considered that the AGC circuit and the clock regenerating circuit are included in the configuration of the VSB receiver, however, the following problems arise depending on a method of setting the loop gain of each of the circuits.

First, consider a case where the loop gain of the AGC circuit is set to a large value.

In this case, the speed of AGC processing following a feedback signal is increased, so that the loop gain of the AGC circuit converges at high speed. In this case, however, the value of the result of AGC detection (an AGC voltage) is liable to be changed. When a ghost disturbance exists in the received signal, therefore, the result of the AGC detection is changed by a ghost component. Therefore, an error occurs in signal processing in the waveform equalizer 203 in the succeeding stage, resulting in a degraded ghost removal capability.

The configuration of the waveform equalizer 203 described in the above-mentioned document is taken as an example, to describe the cause of errors occurring in the signal processing in the above-mentioned case. FIG. 21 is a block diagram showing the configuration of the waveform equalizer 203 described in the above-mentioned document. FIG. 22 is a diagram for explaining the reason why judgment in the waveform equalizer 203 is erroneous.

The waveform equalizer 203 calculates an error signal on the basis of an output of a feedback filter and an output passing through a slicer, and calculates each filter coefficient on the basis of the error signal. The filter coefficient is gradually changed such that a ghost is removed, and the value is hardly changed after the ghost is removed. That is, the waveform equalizer 203 calculates a filter coefficient on the basis of an error between each data and a reference value in a region including the data. Consequently, the waveform equalizer 203 calculates, with respect to data in a +5 region (● mark in FIG. 22), an error between the data and the value of +5, and calculates a filter coefficient on the basis of the error. When data originally existing in the +5 region is moved into a +7 region (▼ mark in FIG. 22) by a ghost disturbance, however, the waveform equalizer 203 calculates, with respect to the data, an error between the data and the value of +7, and calculates an incorrect filter coefficient on the basis of the error.

Similarly, consider a case where the loop gain of the clock regenerating circuit is set to a large value.

In this case, the speed of clock regeneration processing following a feedback signal is increased, so that the loop gain of the clock regenerating circuit converges at high speed. When a ghost disturbance exists in the received signal in this case, however, the clock regeneration processing sensibly responds to a ghost component (the clock frequency is liable to vary). Accordingly, jitter occurs in a regenerated clock in the VSB receiver, so that an error occurs in the received signal.

Then, consider a case where the loop gains of the AGC circuit and the clock regenerating circuit are respectively set to small values.

In this case, in the AGC circuit, the speed of AGC processing following a feedback signal is decreased, resulting in an enhanced ghost removal capability. On the other hand, in the clock regenerating circuit, the speed of clock regeneration processing following a feedback signal is decreased, so that an accurate clock can be regenerated without causing jitter. In this case, however, a time period required until the loop gain of each of the circuits has converged as described above, that is, a time period required from the time when a video signal is received until a video is outputted onto a screen is lengthened.

Therefore, an object of the present invention is to provide a VSB receiver in which a reduction of a time period required until convergence is completed and an improvement of a ghost disturbance removal performance are made compatible with each other in an AGC circuit, and a reduction of a time period required until convergence is completed and accurate clock regeneration are further made compatible with each other in a clock regenerating circuit.

DISCLOSURE OF THE INVENTION

The present invention has the following features in order to attain the above-mentioned object.

A first aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation; and automatic gain control part whose loop gain is feedback-controlled through a gain detector, an amplifier, and a loop filter on the basis of the segment synchronizing signal detected by the segment synchronization detection part such that the level of the segment synchronizing signal is constant, the automatic gain control part switching the loop filter to a wide band until the segment synchronizing signal is detected, while switching the loop filter to a narrow band after it is detected in accordance with the segment synchronization detecting signal indicating the presence or absence of the detection of the segment synchronizing signal.

Preferably, as in a second aspect, the loop filter is a wide-band loop filter and a narrow-band loop filter, each of which is constituted by a resistor and a capacitor, and the automatic gain control part switches the value of a time constant determined by the resistor and the capacitor in accordance with the segment synchronization detecting signal, to control the bandwidth of the loop filter.

Preferably, as in a third aspect, the loop filter is a digital filter whose bandwidth can be varied in accordance with a filter coefficient separately given thereto, and the automatic gain control part switches the filter coefficient given to the digital filter in accordance with the segment synchronization detecting signal, to control the bandwidth of the loop filter.

As described above, according to the first to third aspects, the loop filter in the automatic gain control part is switched to a wide band until the segment synchronizing signal is detected such that a time period required for the detection is shortened, while being switched to a narrow band in order to improve the ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance.

A fourth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation; and automatic gain control part whose loop gain is feedback-controlled through again detector, an amplifier, and a loop filter on the basis of the segment synchronizing signal detected by the segment synchronization detection part such that the level of the segment synchronizing signal is constant, the automatic gain control part switching the gain of the amplifier to a large value until the segment synchronizing signal is detected, while switching the gain of the amplifier to a small value after it is detected in accordance with the segment synchronization detecting signal indicating the presence or absence of the detection of the segment synchronizing signal.

Preferably, as in a fifth aspect, the amplifier is constituted by a high-gain operational amplifier and a low-gain operational amplifier, and the automatic gain control part switches the amplifier to either one of the operational amplifiers in accordance with the segment synchronization detecting signal, to control the gain of the amplifier.

Preferably, as in a sixth aspect, the amplifier is a multiplier whose amplitude value can be varied in accordance with a coefficient separately given thereto, and the automatic gain control part switches the coefficient given to the multiplier in accordance with the segment synchronization detecting signal, to control the gain of the amplifier.

As described above, according to the fourth to sixth aspects, the amplitude gain of the automatic gain control part is switched to a large value until the segment synchronizing signal is detected such that a time period required for the detection is shortened, while being switched to a small value in order to improve a ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance.

A seventh aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation;

automatic gain control part whose loop gain is feedback-controlled through a gain detector, an amplifier, and a loop filter on the basis of the segment synchronizing signal detected by the segment synchronization detection part such that the level of the segment synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the segment synchronizing signal detected by the segment synchronization detection part, each of the automatic gain control part and the clock regeneration part switching the loop filter to a wide band until the segment synchronizing signal is detected, while switching the loop filter to a narrow band after it is detected in accordance with the segment synchronization detecting signal indicating the presence or absence of the detection of the segment synchronizing signal.

Preferably, as in an eighth aspect, the loop filter in each of the automatic gain control part and the clock regeneration part is a wide-band loop filter and a narrow-band loop filter, each of which is constituted by a resistor and a capacitor, and each of the automatic gain control part and the clock regeneration part switches the value of a time constant determined by the resistor and the capacitor in accordance with the segment synchronization detecting signal, to control the bandwidth of the loop filter.

Preferably, as in a ninth aspect, the loop filter in each of the automatic gain control part and the clock regeneration part is a digital filter whose bandwidth can be varied in accordance with a filter coefficient separately given thereto, and each of the automatic gain control part and the clock regeneration part switches the filter coefficient given to the digital filter in accordance with the segment synchronization detecting signal, to control the bandwidth of the loop filter.

Preferably, as in a tenth aspect, the loop filter in the automatic gain control part is a wide-band loop filter and a narrow-band loop filter, each of which is constituted by a resistor and a capacitor, and the loop filter in the clock regeneration part is a digital filter whose bandwidth can be varied in accordance with a filter coefficient separately given thereto, and the automatic gain control part switches the value of a time constant determined by the resistor and the capacitor in accordance with the segment synchronization detecting signal, and the clock regeneration part switches the filter coefficient given to the digital filter in accordance with the segment synchronization detecting signal, to respectively control the bandwidths of the loop filters.

Preferably, as in an eleventh aspect, the loop filter in the automatic gain control part is a digital filter whose bandwidth can be varied in accordance with a filter coefficient separately given thereto, and the loop filter in the clock regeneration part is a wide-band loop filter and a narrow-band loop filter, each of which is constituted by a resistor and a capacitor, and the automatic gain control part switches the filter coefficient given to the digital filter in accordance with the segment synchronization detecting signal, and the clock regeneration part switches the value of a time constant determined by the resistor and the capacitor in accordance with the segment synchronization detecting signal, to respectively control the bandwidths of the loop filters.

As described above, according to the seventh to eleventh aspects, the loop filter in each of the automatic gain control part and the clock regeneration part is switched to a wide band until the segment synchronizing signal is detected such that a time period required for the detection is shortened, while being switched to a narrow band in order to improve a ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance. Further, no jitter occurs in a regenerated clock in the VSB receiver, so that no error occurs in the received signal.

A twelfth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation;

automatic gain control part whose loop gain is feedback-controlled through a gain detector, an amplifier, and a loop filter on the basis of the segment synchronizing signal detected by the segment synchronization detection part such that the level of the segment synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the segment synchronizing signal detected by the segment synchronization detection part, each of the automatic gain control part and the clock regeneration part switching the gain of the amplifier to a large value until the segment synchronizing signal is detected, while switching the gain of the amplifier to a small value after it is detected in accordance with the segment synchronization detecting signal indicating the presence or absence of the detection of the segment synchronizing signal.

Preferably, as in a thirteenth aspect, the amplifier in each of the automatic gain control part and the clock regeneration part is constituted by a high-gain operational amplifier and a low-gain operational amplifier, and each of the automatic gain control part and the clock regeneration part switches the amplifier to either one of the operational amplifiers in accordance with the segment synchronization detecting signal, to control the gain of the amplifier.

Preferably, as in a fourteenth aspect, the amplifier in each of the automatic gain control part and the clock regeneration part is a multiplier whose amplitude value can be varied in accordance with a coefficient separately given thereto, and each of the automatic gain control part and the clock regeneration part switches the coefficient given to the multiplier in accordance with the segment synchronization detecting signal, to control the gain of the amplifier.

Preferably, as in a fifteenth aspect, the amplifier in the automatic gain control part is constituted by a high-gain operational amplifier and a low-gain operational amplifier, and the amplifier in the clock regeneration part is a multiplier whose amplitude value can be varied in accordance with a coefficient separately given thereto, and the automatic gain control part switches the amplifier to either one of the operational amplifiers in accordance with the segment synchronization detecting signal, and the clock regeneration part switches the coefficient given to the multiplier in accordance with the segment synchronization detecting signal, to respectively control the gains of the amplifiers.

Preferably, as in a sixteenth aspect, the amplifier in the automatic gain control part is a multiplier whose amplitude value can be varied in accordance with a coefficient separately given thereto, and the amplifier in the clock regeneration part is constituted by a high-gain operational amplifier and a low-gain operational amplifier, and the automatic gain control part switches the coefficient given to the multiplier in accordance with the segment synchronization detecting signal, and the clock regeneration part switches the amplifier to either one of the operational amplifiers in accordance with the segment synchronization detecting signal, to respectively control the gains of the amplifiers.

As described above, according to the twelfth to sixteenth aspects, the amplitude gain of each of the automatic gain control part and the clock regeneration part is switched to a large value until the segment synchronizing signal is detected such that a time period required for the detection is shortened, while being switched to a small value in order to improve a ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance. Further, no jitter occurs in a regenerated clock in the VSB receiver, so that no error occurs in the received signal.

A seventeenth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation;

automatic gain control part whose loop gain is feedback-controlled through a gain detector, an amplifier, and a loop filter on the basis of the segment synchronizing signal detected by the segment synchronization detection part such that the level of the segment synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the segment synchronizing signal detected by the segment synchronization detection part, the automatic gain control part switching the loop filter to a wide band until the segment synchronizing signal is detected, while switching the loop filter to a narrow band after it is detected in accordance with the segment synchronization detecting signal indicating the presence or absence of the detection of the segment synchronizing signal, and the clock regeneration part switching the gain of the amplifier to a large value until the segment synchronizing signal is detected, while switching the gain of the amplifier to a small value after it is detected in accordance with the segment synchronization detecting signal.

Preferably, as in an eighteenth aspect, the loop filter in the automatic gain control part is a wide-band loop filter and a narrow-band loop filter, each of which is constituted by a resistor and a capacitor, and the amplifier in the clock regeneration part is constituted by a high-gain operational amplifier and a low-gain operational amplifier, and the automatic gain control part switches the value of a time constant determined by the resistor and the capacitor in accordance with the segment synchronization detecting signal, to control the bandwidth of the loop filter, and the clock regeneration part switches the amplifier to either one of the operational amplifiers in accordance with the segment synchronization detecting signal, to control the gain of the amplifier.

Preferably, as in a nineteenth aspect, the loop filter in the automatic gain control part is a wide-band loop filter and a narrow-band loop filter, each of which is constituted by a resistor and a capacitor, and the amplifier in the clock regeneration part is a multiplier whose amplitude value can be varied in accordance with a coefficient separately given thereto, and the automatic gain control part switches the value of a time constant determined by the resistor and the capacitor in accordance with the segment synchronization detecting signal, to control the bandwidth of the loop filter, and the clock regeneration part switches the coefficient given to the multiplier in accordance with the segment synchronization detecting signal, to control the gain of the amplifier.

Preferably, as in a twentieth aspect, the loop filter in the automatic gain control part is a digital filter whose bandwidth can be varied in accordance with a filter coefficient separately given thereto, and the amplifier in the clock regeneration part is constituted by a high-gain operational amplifier and a low-gain operational amplifier, and the automatic gain control part switches the filter coefficient given to the digital filter in accordance with the segment synchronization detecting signal, to control the bandwidth of the loop filter, and the clock regeneration part switches the amplifier to either one of the operational amplifiers in accordance with the segment synchronization detecting signal, to control the gain of the amplifier.

Preferably, as in a twenty-first aspect, the loop filter in the automatic gain control part is a digital filter whose bandwidth can be varied in accordance with a filter coefficient separately given thereto, and the amplifier in the clock regeneration part is a multiplier whose amplitude value can be varied in accordance with a coefficient separately given thereto, and the automatic gain control part switches the filter coefficient given to the digital filter in accordance with the segment synchronization detecting signal, to control the bandwidth of the loop filter, and the clock regeneration part switches the coefficient given to the multiplier in accordance with the segment synchronization detecting signal, to control the gain of the amplifier.

As described above, according to the seventeenth to twenty-first aspects, the loop filter in the automatic gain control part and the amplitude gain of the clock regeneration part are respectively switched to a wide band and a large value until the segment synchronizing signal is detected such that a time period required for the detection is shortened, while being respectively switched to a narrow band and a small value in order to improve a ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance. Further, no jitter occurs in a regenerated clock in the VSB receiver, so that no error occurs in the received signal.

A twenty-second aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection part for detecting the segment synchronizing signal from the received signal which has been subjected to the multi-valued VSB modulation;

automatic gain control part whose loop gain is feedback-controlled through a gain detector, an amplifier, and a loop filter on the basis of the segment synchronizing signal detected by the segment synchronization detection part such that the level of the segment synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the segment synchronizing signal detected by the segment synchronization detection part, the automatic gain control part switching the gain of the amplifier to a large value until the segment synchronizing signal is detected, while switching the gain of the amplifier to a small value after it is detected in accordance with the segment synchronization detecting signal indicating the presence or absence of the detection of the segment synchronizing signal, and the clock regeneration part switching the loop filter to a wide band until the segment synchronizing signal is detected, while switching the loop filter to a narrow band after it is detected in accordance with the segment synchronization detecting signal.

Preferably, as in a twenty-third aspect, the amplifier in the automatic gain control part is constituted by a high-gain operational amplifier and a low-gain operational amplifier, and the loop filter in the clock regeneration part is a wide-band loop filter and a narrow-band loop filter, each of which is constituted by a resistor and a capacitor, and the automatic gain control part switches the amplifier to either one of the operational amplifiers in accordance with the segment synchronization detecting signal, to control the gain of the amplifier, and the clock regeneration part switches the value of a time constant determined by the resistor and the capacitor in accordance with the segment synchronization detecting signal, to control the bandwidth of the loop filter.

Preferably, as in a twenty-fourth aspect, the amplifier in the automatic gain control part is constituted by a high-gain operational amplifier and a low-gain operational amplifier, and the loop filter in the clock regeneration part is a digital filter whose bandwidth can be varied in accordance with a filter coefficient separately given thereto, and the automatic gain control part switches the amplifier to either one of the operational amplifiers in accordance with the segment synchronization detecting signal, to control the gain of the amplifier, and the clock regeneration part switches the filter coefficient given to the digital filter in accordance with the segment synchronization detecting signal, to control the bandwidth of the loop filter.

Preferably, as in a twenty-fifth aspect, the amplifier in the automatic gain control part is a multiplier whose amplitude value can be varied in accordance with a coefficient separately given thereto, and the loop filter in the clock regeneration part is a wide-band loop filter and a narrow-band loop filter, each of which is constituted by a resistor and a capacitor, and the automatic gain control part switches the coefficient given to the multiplier in accordance with the segment synchronization detecting signal, to control the gain of the amplifier, and the clock regeneration part switches the value of a time constant determined by the resistor and the capacitor in accordance with the segment synchronization detecting signal, to control the bandwidth of the loop filter.

Preferably, as in a twenty-sixth aspect, the amplifier in the automatic gain control part is a multiplier whose amplitude value can be varied in accordance with a coefficient separately given thereto, and the loop filter in the clock regeneration part is a digital filter whose bandwidth can be varied in accordance with a filter coefficient separately given thereto, and the automatic gain control part switches the coefficient given to the multiplier in accordance with the segment synchronization detecting signal, to control the gain of the amplifier, and the clock regeneration part switches the filter coefficient given to the digital filter in accordance with the segment synchronization detecting signal, to control the bandwidth of the loop filter.

As described above, as in the twenty-second to twenty-sixth aspects, the amplitude gain of the automatic gain control part and the loop filter in the clock regeneration part are respectively switched to a large value and a wide band until the segment synchronizing signal is detected such that a time period required for the detection is shortened, while being respectively switched to a small value and a narrow band in order to improve a ghost disturbance removal performance after the segment synchronizing signal is detected, to control the loop gain. Even when there is a ghost disturbance in the received signal, therefore, it is possible to shorten the time period required to detect the segment synchronizing signal as well as to improve the ghost disturbance removal performance. Further, no jitter occurs in a regenerated clock in the VSB receiver, so that no error occurs in the received signal.

A twenty-seventh aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation; and automatic gain control part whose loop gain is feedback-controlled through a gain detector, an amplifier, and a loop filter on the basis of the field synchronizing signal detected by the field synchronization detection part such that the level of the field synchronizing signal is constant, the automatic gain control part switching the loop filter to a wide band until the field synchronizing signal is detected, while switching the loop filter to a narrow band after it is detected in accordance with the field synchronization detecting signal indicating the presence or absence of the detection of the field synchronizing signal.

Preferably, as in a twenty-eighth aspect, the loop filter is a wide-band loop filter and a narrow-band loop filter, each of which is constituted by a resistor and a capacitor, and the automatic gain control part switches the value of a time constant determined by the resistor and the capacitor in accordance with the field synchronization detecting signal, to control the bandwidth of the loop filter, Preferably, as in a twenty-ninth aspect, the loop filter is a digital filter whose bandwidth can be varied in accordance with a filter coefficient separately given thereto, and the automatic gain control part switches the filter coefficient given to the digital filter in accordance with the field synchronization detecting signal, to control the bandwidth of the loop filter.

As described above, as in the twenty-seventh to twenty-ninth aspects, the loop filter in the automatic gain control part is switched to a wide band until the field synchronizing signal is detected such that a time period required for the detection is shortened, while being switched to a narrow band in order to improve a ghost disturbance removal performance after the field synchronizing signal is detected, to control the loop gain. Even when there is a ghost disturbance in the received signal, therefore, it is possible to shorten the time period required to detect the field synchronizing signal as well as to improve the ghost disturbance removal performance.

A thirtieth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation; and automatic gain control part whose loop gain is feedback-controlled through a gain detector, an amplifier, and a loop filter on the basis of the field synchronizing signal detected by the field synchronization detection part such that the level of the field synchronizing signal is constant, the automatic gain control part switching the gain of the amplifier to a large value until the field synchronizing signal is detected, while switching the gain of the amplifier to a small value after it is detected in accordance with the field synchronization detecting signal indicating the presence or absence of the detection of the field synchronizing signal.

Preferably, as in a thirty-first aspect, the amplifier is constituted by a high-gain operational amplifier and a low-gain operational amplifier, and the automatic gain control part switches the amplifier to either one of the operational amplifiers in accordance with the field synchronization detecting signal, to control the gain of the amplifier.

Preferably, as in a thirty-second aspect, the amplifier is a multiplier whose amplitude value can be varied in accordance with a coefficient separately given thereto, and the automatic gain control part switches the coefficient given to the multiplier in accordance with the field synchronization detecting signal, to control the gain of the amplifier.

As described above, according to the thirtieth to thirty-second aspects, the amplitude gain of the automatic gain control part is switched to a large value until the field synchronizing signal is detected such that a time period required for the detection is shortened, while being switched to a small value in order to improve a ghost disturbance removal performance after the field synchronizing signal is detected, to control the loop gain. Even when there is a ghost disturbance in the received signal, therefore, it is possible to shorten the time period required to detect the field synchronizing signal as well as to improve the ghost disturbance removal performance.

A thirty-third aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation;

automatic gain control part whose loop gain is feedback-controlled through a gain detector, an amplifier, and a loop filter on the basis of the field synchronizing signal detected by the field synchronization detection part such that the level of the field synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the field synchronizing signal detected by the field synchronization detection part, each of the automatic gain control part and the clock regeneration part switching the loop filter to a wide band until the field synchronizing signal is detected, while switching the loop filter to a narrow band after it is detected in accordance with the field synchronization detecting signal indicating the presence or absence of the detection of the field synchronizing signal.

Preferably, as in a thirty-fourth aspect, the loop filter in each of the automatic gain control part and the clock regeneration part is a wide-band loop filter and a narrow-band loop filter, each of which is constituted by a resistor and a capacitor, and each of the automatic gain control part and the clock regeneration part switches the value of a time constant determined by the resistor and the capacitor in accordance with the field synchronization detecting signal, to control the bandwidth of the loop filter.

Preferably, as in a thirty-fifth aspect, the loop filter in each of the automatic gain control part and the clock regeneration part is a digital filter whose bandwidth can be varied in accordance with a filter coefficient separately given thereto, and each of the automatic gain control part and the clock regeneration part switches the filter coefficient given to the digital filter in accordance with the field synchronization detecting signal, to control the bandwidth of the loop filter.

Preferably, as in a thirty-sixth aspect, the loop filter in the automatic gain control part is a wide-band loop filter and a narrow-band loop filter, each of which is constituted by a resistor and a capacitor, and the loop filter in the clock regeneration part is a digital filter whose bandwidth can be varied in accordance with a filter coefficient separately given thereto, and the automatic gain control part switches the value of a time constant determined by the resistor and the capacitor in accordance with the field synchronization detecting signal, and the clock regeneration part switches the filter coefficient given to the digital filter in accordance with the field synchronization detecting signal, to respectively control the bandwidths of the loop filters.

Preferably, as in a thirty-seventh aspect, the loop filter in the automatic gain control part is a digital filter whose bandwidth can be varied in accordance with a filter coefficient separately given thereto, and the loop filter in the clock regeneration part is a wide-band loop filter and a narrow-band loop filter, each of which is constituted by a resistor and a capacitor, and the automatic gain control part switches the filter coefficient given to the digital filter in accordance with the field synchronization detecting signal, and the clock regeneration part switches the value of a time constant determined by the resistor and the capacitor in accordance with the field synchronization detecting signal, to respectively control the bandwidths of the loop filters.

As described above, according to the thirty-third to thirty-seventh aspects, the loop filter in each of the automatic gain control part and the clock regeneration part is switched to a wide band until the field synchronizing signal is detected such that a time period required for the detection is shortened, while being switched to a narrow band in order to improve a ghost disturbance removal performance after the field synchronizing signal is detected. Even when there is a ghost disturbance in the received signal, therefore, it is possible to shorten the time period required to detect the field synchronizing signal as well as to improve the ghost disturbance removal performance. Further, no jitter occurs in a regenerated clock in the VSB receiver, so that no error occurs in the received signal.

A thirty-eighth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation;

automatic gain control part whose loop gain is feedback-controlled through a gain detector, an amplifier, and a loop filter on the basis of the field synchronizing signal detected by the field synchronization detection part such that the level of the field synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the field synchronizing signal detected by the field synchronization detection part, each of the automatic gain control part and the clock regeneration part switching the gain of the amplifier to a large value until the field synchronizing signal is detected, while switching the gain of the amplifier to a small value after it is detected in accordance with the field synchronization detecting signal indicating the presence or absence of the detection of the field synchronizing signal.

Preferably, as in a thirty-ninth aspect, the amplifier in each of the automatic gain control part and the clock regeneration part is constituted by a high-gain operational amplifier and a low-gain operational amplifier, and each of the automatic gain control part and the clock regeneration part switches the amplifier to either one of the operational amplifiers in accordance with the field synchronization detecting signal, to control the gain of the amplifier.

Preferably, as in a fortieth aspect, the amplifier in each of the automatic gain control part and the clock regeneration part is a multiplier whose amplitude value can be varied in accordance with a coefficient separately given thereto, and each of the automatic gain control part and the clock regeneration part switches the coefficient given to the multiplier in accordance with the field synchronization detecting signal, to control the gain of the amplifier.

Preferably, as in a forty-first aspect, the amplifier in the automatic gain control part is constituted by a high-gain operational amplifier and a low-gain operational amplifier, and the amplifier in the clock regeneration part is a multiplier whose amplitude value can be varied in accordance with a coefficient separately given thereto, and the automatic gain control part switches the amplifier to either one of the operational amplifiers in accordance with the field synchronization detecting signal, and the clock regeneration part switches the coefficient given to the multiplier in accordance with the field synchronization detecting signal, to respectively control the gains of the amplifiers.

Preferably, as in a forty-second aspect, the amplifier in the automatic gain control part is a multiplier whose amplitude value can be varied in accordance with a coefficient separately given thereto, and the amplifier in the clock regeneration part is constituted by a high-gain operational amplifier and a low-gain operational amplifier, and the automatic gain control part switches the coefficient given to the multiplier in accordance with the field synchronization detecting signal, and the clock regeneration part switches the amplifier to either one of the operational amplifiers in accordance with the field synchronization detecting signal, to respectively control the gains of the amplifiers.

As described above, according to the thirty-eighth to forty-second aspects, the amplitude gain of each of the automatic gain control part and the clock regeneration part is switched to a large value until the field synchronizing signal is detected such that a time period required for the detection is shortened, while being switched to a small value in order to improve a ghost disturbance removal performance after the field synchronizing signal is detected, to control the loop gain. Even when there is a ghost disturbance in the received signal, therefore, it is possible to shorten the time period required to detect the field synchronizing signal as well as to improve the ghost disturbance removal performance. Further, no jitter occurs in a regenerated clock in the VSB receiver, so that no error occurs in the received signal.

A forty-third aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation;

automatic gain control part whose loop gain is feedback-controlled through a gain detector, an amplifier, and a loop filter on the basis of the field synchronizing signal detected by the field synchronization detection part such that the level of the field synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the field synchronizing signal detected by the field synchronization detection part, the automatic gain control part switching the loop filter to a wide band until the field synchronizing signal is detected, while switching the loop filter to a narrow band after it is detected in accordance with the field synchronization detecting signal indicating the presence or absence of the detection of the field synchronizing signal, and the clock regeneration part switching the gain of the amplifier to a large value until the field synchronizing signal is detected, while switching the gain of the amplifier to a small value after it is detected in accordance with the field synchronization detecting signal.

Preferably, as in a forty-fourth aspect, the loop filter in the automatic gain control part is a wide-band loop filter and a narrow-band loop filter, each of which is constituted by a resistor and a capacitor, and the amplifier in the clock regeneration part is constituted by a high-gain operational amplifier and a low-gain operational amplifier, and the automatic gain control part switches the value of a time constant determined by the resistor and the capacitor in accordance with the field synchronization detecting signal, to control the bandwidth of the loop filter, and the clock regeneration part switches the amplifier to either one of the operational amplifiers in accordance with the field synchronization detecting signal, to control the gain of the amplifier.

Preferably, as in a forty-fifth aspect, the loop filter in the automatic gain control part is a wide-band loop filter and a narrow-band loop filter, each of which is constituted by a resistor and a capacitor, and the amplifier in the clock regeneration part is a multiplier whose amplitude value can be varied in accordance with a coefficient separately given thereto, and the automatic gain control part switches the value of a time constant determined by the resistor and the capacitor in accordance with the field synchronization detecting signal, to control the bandwidth of the loop filter, and the clock regeneration part switches the coefficient given to the multiplier in accordance with the field synchronization detecting signal, to control the gain of the amplifier.

Preferably, as in a forty-sixth aspect, the loop filter in the automatic gain control part is a digital filter whose bandwidth can be varied in accordance with a filter coefficient separately given thereto, and the amplifier in the clock regeneration part is constituted by a high-gain operational amplifier and a low-gain operational amplifier, and the automatic gain control part switches the filter coefficient given to the digital filter in accordance with the field synchronization detecting signal, to control the bandwidth of the loop filter, and the clock regeneration part switches the amplifier to either one of the operational amplifiers in accordance with the field synchronization detecting signal, to control the gain of the amplifier.

Preferably, as in a forty-seventh aspect, the loop filter in the automatic gain control part is a digital filter whose bandwidth can be varied in accordance with a filter coefficient separately given thereto, and the amplifier in the clock regeneration part is a multiplier whose amplitude value can be varied in accordance with a coefficient separately given thereto, and the automatic gain control part switches the filter coefficient given to the digital filter in accordance with the field synchronization detecting signal, to control the bandwidth of the loop filter, and the clock regeneration part switches the coefficient given to the multiplier in accordance with the field synchronization detecting signal, to control the gain of the amplifier.

As described above, as in the forty-third to forty-seventh aspects, the loop filter in the automatic gain control part and the amplitude gain of the clock regeneration part are respectively switched to a wide band and a large value until the field synchronizing signal is detected such that a time period required for the detection is shortened, while being respectively switched to a narrow band and a small value in order to improve a ghost disturbance removal performance after the field synchronizing signal is detected, to control the loop gain. Even when there is a ghost disturbance in the received signal, therefore, it is possible to shorten the time period required to detect the field synchronizing signal as well as to improve the ghost disturbance removal performance. Further, no jitter occurs in a regenerated clock in the VSB receiver, so that no error occurs in the received signal.

A forty-eighth aspect is directed to a VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection part for detecting the field synchronizing signal from the received signal which has been subjected to the multi-valued VSB modulation;

automatic gain control part whose loop gain is feedback-controlled through a gain detector, an amplifier, and a loop filter on the basis of the field synchronizing signal detected by the field synchronization detection part such that the level of the field synchronizing signal is constant; and clock regeneration part whose loop gain is feedback-controlled through a clock frequency detector, an amplifier, a loop filter, and a variable clock oscillator such that a clock frequency to be regenerated coincides with the clock frequency of the received signal on the basis of the field synchronizing signal detected by the field synchronization detection part, the automatic gain control part switching the gain of the amplifier to a large value until the field synchronizing signal is detected, while switching the gain of the amplifier to a small value after it is detected in accordance with the field synchronization detecting signal indicating the presence or absence of the detection of the field synchronizing signal, and the clock regeneration part switching the loop filter to a wide band until the field synchronizing signal is detected, while switching the loop filter to a narrow band after it is detected in accordance with the field synchronization detecting signal.

Preferably, as in a forty-ninth aspect, the amplifier in the automatic gain control part is constituted by a high-gain operational amplifier and a low-gain operational amplifier, and the loop filter in the clock regeneration part is a wide-band loop filter and a narrow-band loop filter, each of which is constituted by a resistor and a capacitor, and the automatic gain control part switches the amplifier to either one of the operational amplifiers in accordance with the field synchronization detecting signal, to control the gain of the amplifier, and the clock regeneration part switches the value of a time constant determined by the resistor and the capacitor in accordance with the field synchronization detecting signal, to control the bandwidth of the loop filter.

Preferably, as in a fiftieth aspect, the amplifier in the automatic gain control part is constituted by a high-gain operational amplifier and a low-gain operational amplifier, and the loop filter in the clock regeneration part is a digital filter whose bandwidth can be varied in accordance with a filter coefficient separately given thereto, and the automatic gain control part switches the amplifier to either one of the operational amplifiers in accordance with the field synchronization detecting signal, to control the gain of the amplifier, and the clock regeneration part switches the filter coefficient given to the digital filter in accordance with the field synchronization detecting signal, to control the bandwidth of the loop filter.

Preferably, as in a fifty-first aspect, the amplifier in the automatic gain control part is a multiplier whose amplitude value can be varied in accordance with a coefficient separately given thereto, and the loop filter in the clock regeneration part is a wide-band loop filter and a narrow-band loop filter, each of which is constituted by a resistor and a capacitor, and the automatic gain control part switches the coefficient given to the multiplier in accordance with the field synchronization detecting signal, to control the gain of the amplifier, and the clock regeneration part switches the value of a time constant determined by the resistor and the capacitor in accordance with the field synchronization detecting signal, to control the bandwidth of the loop filter.

Preferably, as in a fifty-second aspect, the amplifier in the automatic gain control part is a multiplier whose amplitude value can be varied in accordance with a coefficient separately given thereto, and the loop filter in the clock regeneration part is a digital filter whose bandwidth can be varied in accordance with a filter coefficient separately given thereto, and the automatic gain control part switches the coefficient given to the multiplier in accordance with the field synchronization detecting signal, to control the gain of the amplifier, and the clock regeneration part switches the filter coefficient given to the digital filter in accordance with the field synchronization detecting signal, to control the bandwidth of the loop filter.

As described above, as in the forty-eighth to fifty-second aspects, the amplitude gain of the automatic gain control part and the loop filter in the clock regeneration part are respectively switched to a large value and a wide band until the field synchronizing signal is detected such that a time period required for the detection is shortened, while being respectively switched to a small value and a narrow band in order to improve a ghost disturbance removal performance after the field synchronizing signal is detected, to control the loop gain. Even when there is a ghost disturbance in the received signal, therefore, it is possible to shorten the time period required to detect the field synchronizing signal as well as to improve the ghost disturbance removal performance. Further, no jitter occurs in a regenerated clock in the VSB receiver, so that no error occurs in the received signal.

BRIEF DESCRIPTION OF THE DRAWINGS

FIG. 13 is a block diagram showing the configuration of a digital demodulation portion 2 in a VSB receiver according to an eighth embodiment of the present invention;

FIG. 14 is a block diagram showing the configuration of a digital demodulation portion 2 in a VSB receiver according to a ninth embodiment of the present invention;

FIG. 15 is a block diagram showing the configuration of a digital demodulation portion 2 in a VSB receiver according to a tenth embodiment of the present invention;

FIG. 20 is a block diagram showing an example of the configuration of a conventional VSB receiver;

FIG. 21 is a block diagram showing an example of the detailed configuration of a waveform equalizer 203 shown in FIG. 20.

BEST MODE FOR CARRYING OUT THE INVENTION

A VSB receiver for receiving a terrestrial digital broadcasting signal which has been subjected to octal VSB modulation determined in the ATSC standard is taken as an example, to successively describe embodiments of the present invention.

Description is first made of the outline of a VSB receiver using a configuration in each of embodiments of the present invention.

Figure 1:
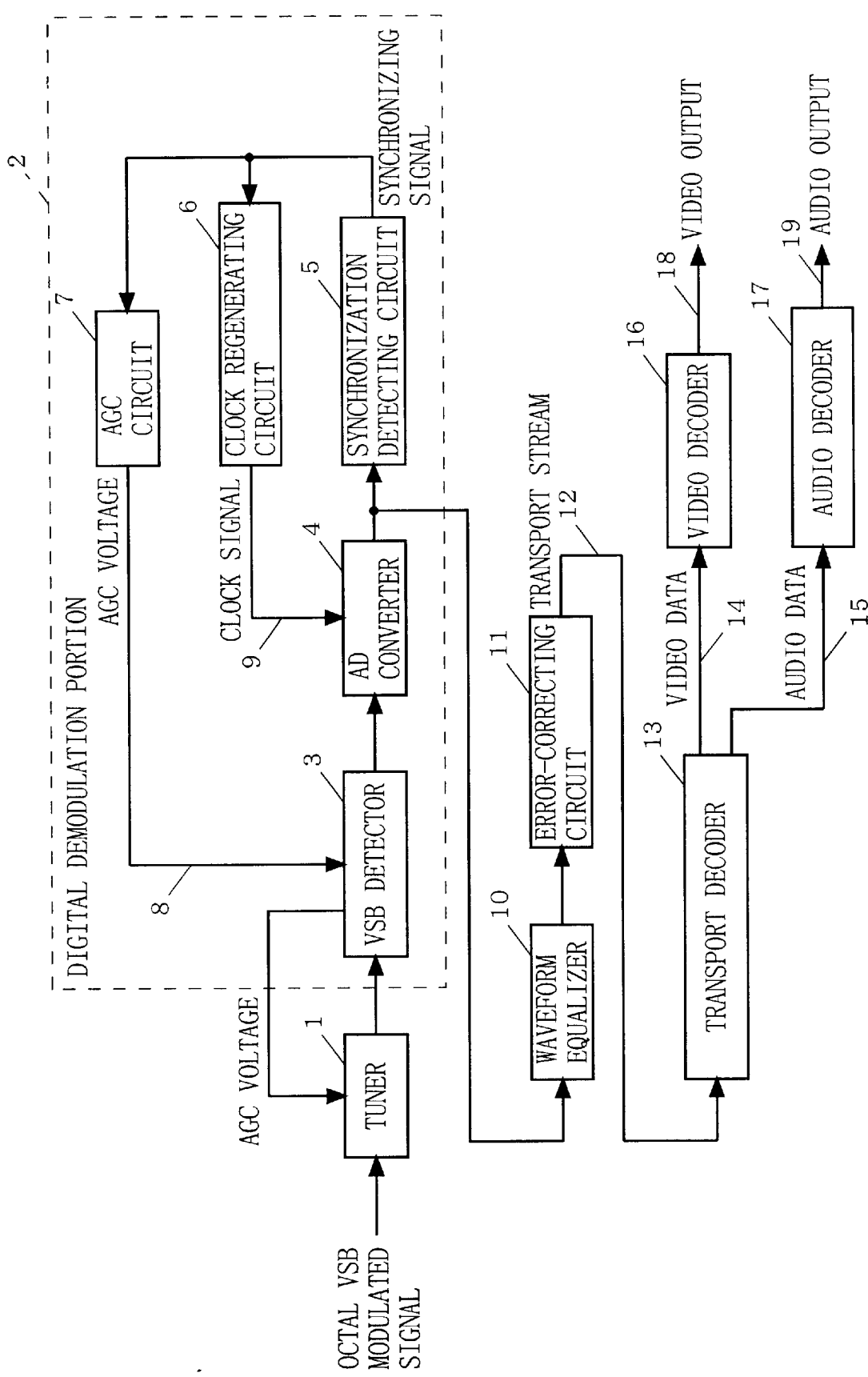
FIG. 1 is a block diagram showing the configuration of a VSB receiver according to an embodiment of the present invention.

FIG. 1 is a block diagram showing the configuration of a VSB receiver according to an embodiment of the present invention. In FIG. 1, the VSB receiver according to the embodiment of the present invention comprises a tuner 1, a digital demodulation portion 2, a waveform equalizer 10, an error-correcting circuit 11, a transport decoder 13, a video decoder 16, and an audio decoder 17. The digital demodulation portion 2 comprises a VSB detector 3, an AD (Analog-to-Digital) converter 4, a synchronization detecting circuit 5, a clock regenerating circuit 6, and an AGC circuit 7.

A signal which has been subjected to octal VSB modulation is inputted to the tuner 1. The tuner 1 converts the octal VSB modulated signal into an IF signal. The VSB detector 3 detects the IF signal as VSB demodulation. The AD converter 4 converts an analog signal obtained by the VSB demodulation into octal digital data, and output the obtained octal digital data.

Figure 2:
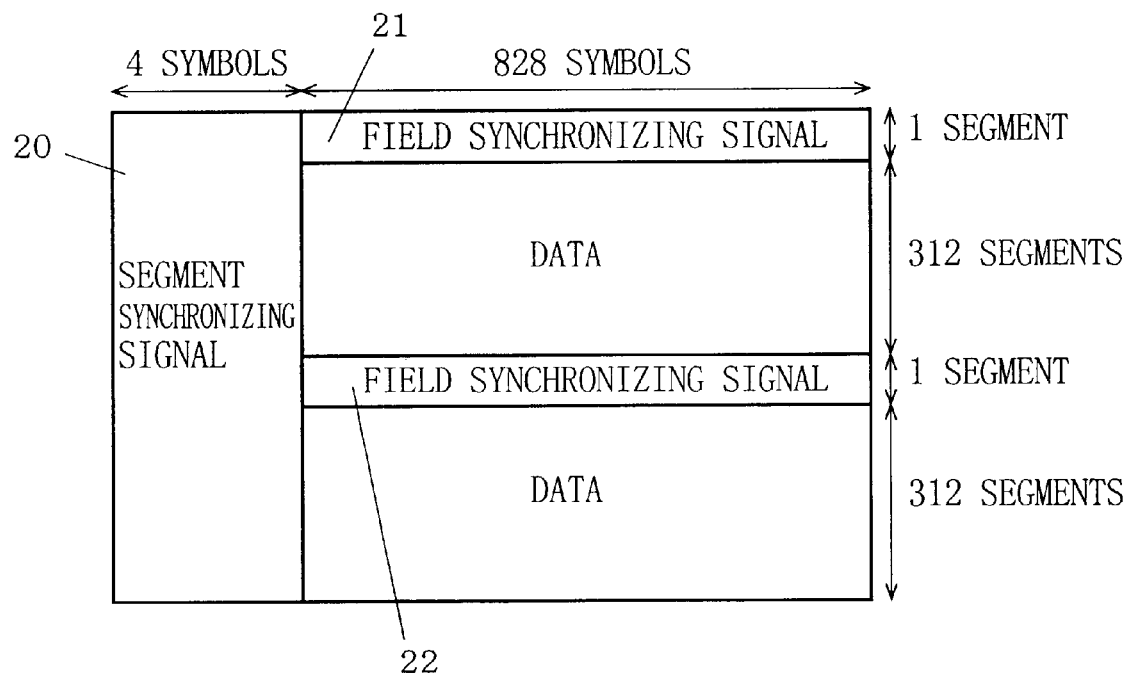
FIG. 2 is a diagram showing an example of the transmission format of an octal VSB modulation signal.
Figure 3:
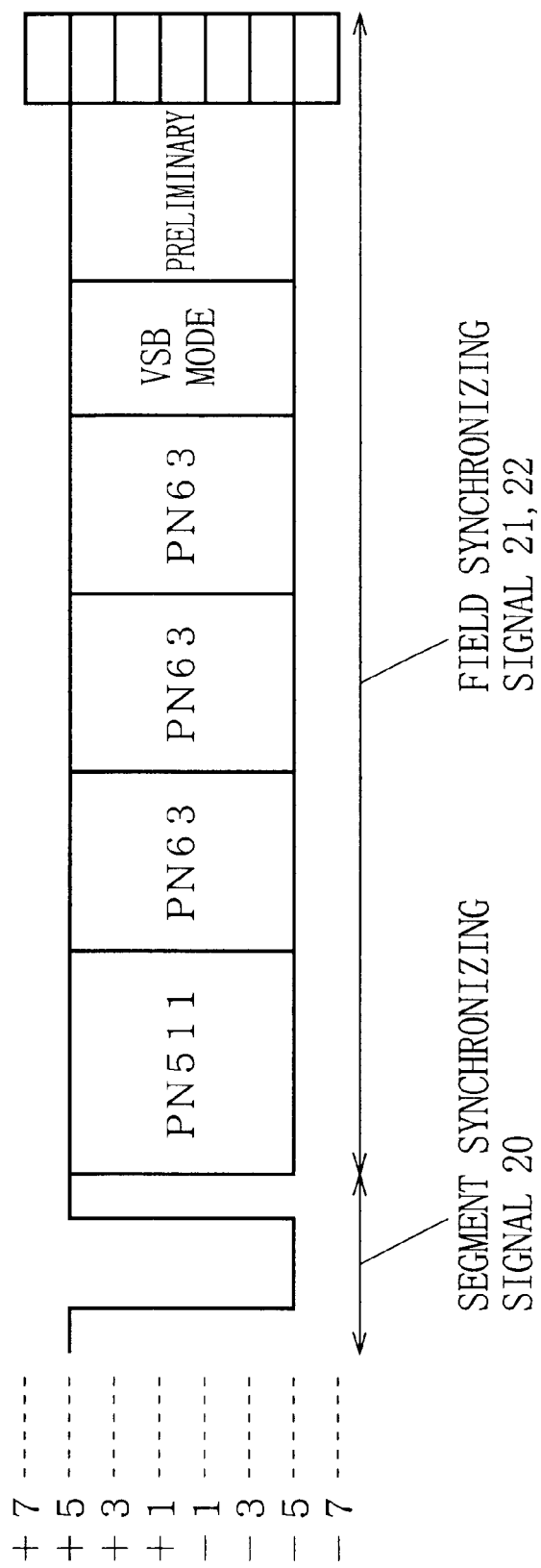
FIG. 3 is a diagram showing the data structures of a segment synchronizing signal 20 and a field synchronizing signal 21 or 22 shown in FIG. 2.

The digital data outputted by the AD converter 4 is data which is constructed in a format shown in FIG. 2 conforming to the ATSC standard. A segment synchronizing signal 20 exists at the head of each of segments, and a field synchronizing signal 21 or 22 exists at the head of each of fields. One segment is constituted by data composed of 832 symbols, and one field is constituted by data composed of 313 segments. FIG. 3 illustrates the data structures of the segment synchronizing signal 20 and the field synchronizing signal 21 or 22. In FIG. 3, the segment synchronizing signal 20 is constructed with a particular pattern in which four symbol data out of octal data represented by −7 to +7 are respectively represented by "+5, −5, −5, +5". Each of the field synchronizing signals 21 and 22 is composed of 828 symbol data with a predetermined particular pattern in a level range of −5 to +5.

The synchronization detecting circuit 5 detects the segment synchronizing signal 20 or the field synchronizing signals 21 and 22 from the digital data outputted by the AD converter 4. A synchronizing signal detecting method which is carried out in the synchronization detecting circuit 5 will be described in embodiments described later. The AGC circuit 7 feeds back- an AGC voltage 8 to the VSB detector 3 such that the data level of the segment synchronizing signal 20 or the field synchronizing signal 21 or 22 is "−5 to +5" on the basis of the synchronizing signal detected by the synchronization detecting circuit 5. The clock regenerating circuit 6 feeds back the clock signal 9 to the AD converter 4 such that a clock frequency in the VSB receiver coincides with the clock frequency of the transmitted digital data on the basis of the synchronizing signal detected by the synchronization detecting circuit 5.

On the other hand, the digital data obtained by the conversion in the AD converter 4 is outputted to the waveform equalizer 10. The waveform equalizer 10 corrects the distortion or the like of a signal waveform which occurs in a transmission path or the like (removes a ghost disturbance). The error correcting circuit 11 subjects the signal waveform whose distortion or the like has been corrected to error correction, and outputs the signal waveform as a transport stream 12. The transport decoder 13 separates the transport stream 12 into video data 14 and audio data 15 on an arbitrary channel. The video decoder 16 decodes the video data 14 obtained by the separation, and outputs the decoded video data 14 as a video signal 18. The audio decoder 17 decodes the audio data 15 obtained by the separation, and outputs the decoded audio data 15 as an audio signal 19.

The VSB receiver according to the embodiment of the present invention having the above-mentioned configuration will be successively described in more detail on the basis of a configuration which can be taken by the digital modulation portion 2.

First Embodiment

Figure 4:
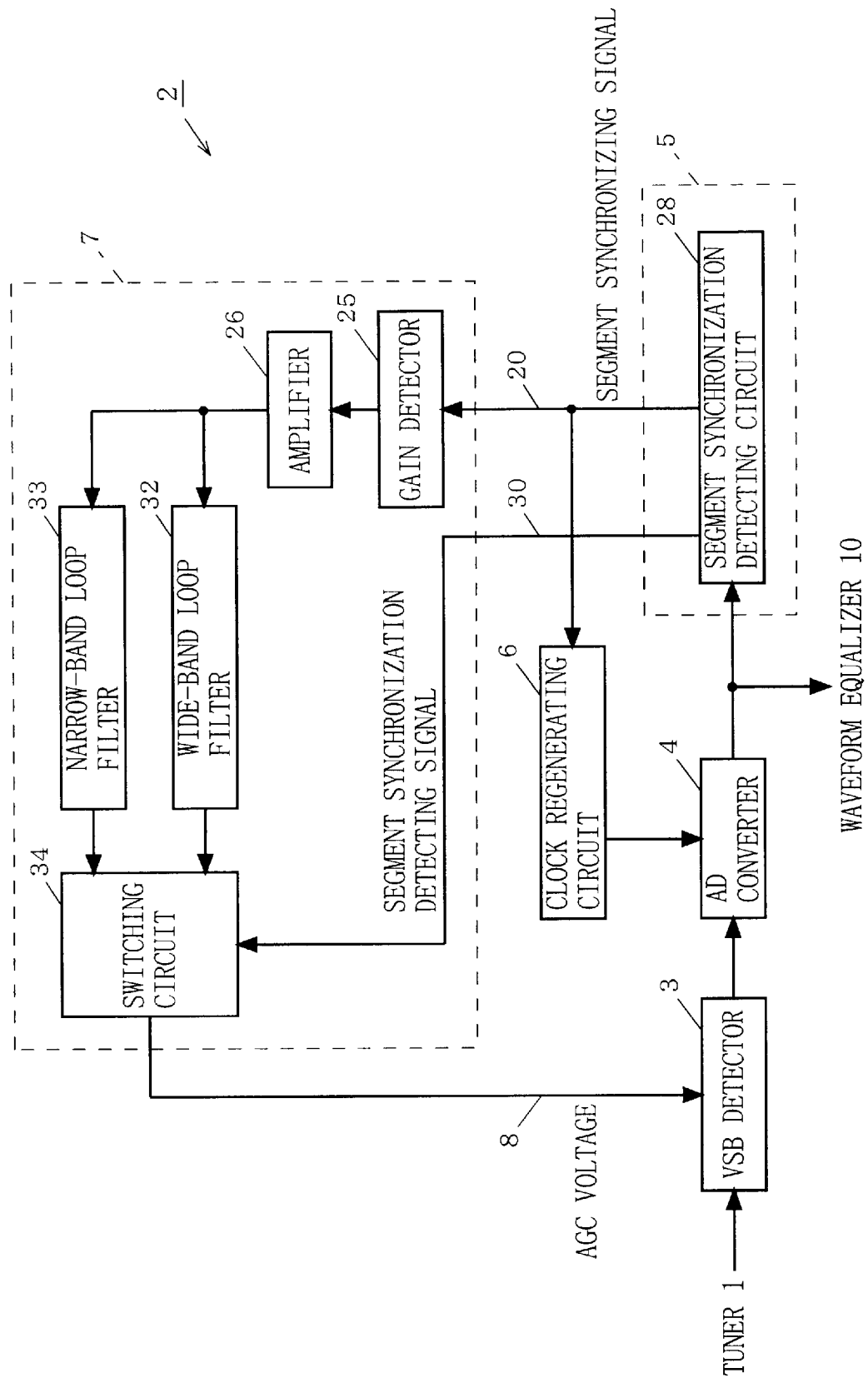
FIG. 4 is a block diagram showing the configuration of a digital demodulation portion 2 in a VSB receiver according to a first embodiment of the present invention.

FIG. 4 is a block diagram showing the configuration of a digital demodulation portion 2 in a VSB receiver according to a first embodiment of the present invention. In FIG. 4, the digital demodulation portion 2 in the first embodiment comprises a VSB detector 3, an AD converter 4, a segment synchronization detecting circuit 28, a gain detector 25, an amplifier 26, a wide-band loop filter 32, a narrow-band loop filter 33, a switching circuit 34, and a clock regenerating circuit 6.

As shown in FIG. 4, in the digital demodulation portion 2 in the first embodiment, the synchronization detecting circuit 5 shown in FIG. 1 is constituted by the segment synchronization detecting circuit 28, and the AGC circuit 7 shown in FIG. 1 is constituted by the gain detector 25, the amplifier 26, the wide-band loop filter 32, the narrow-band loop filter 33, and the switching circuit 34. In FIG. 4, the same constituent elements as those shown in FIG. 1 are assigned the same reference numerals and hence, the description thereof is not repeated.

The constituent elements in the digital demodulation portion 2 in the first embodiment will be successively described.

Digital data (FIG. 2) outputted by the AD converter 4 is inputted to a waveform equalizer 10 and the segment synchronization detecting circuit 28. The segment synchronization detecting circuit 28 subjects the inputted digital data to segment synchronization detection, and outputs to the gain detector 25 a segment synchronizing signal 20 obtained by the detection and outputs to the switching circuit 34 a segment synchronization detecting signal 30 representing the result of judgment whether or not the segment synchronizing signal has been detected.

Figure 5:
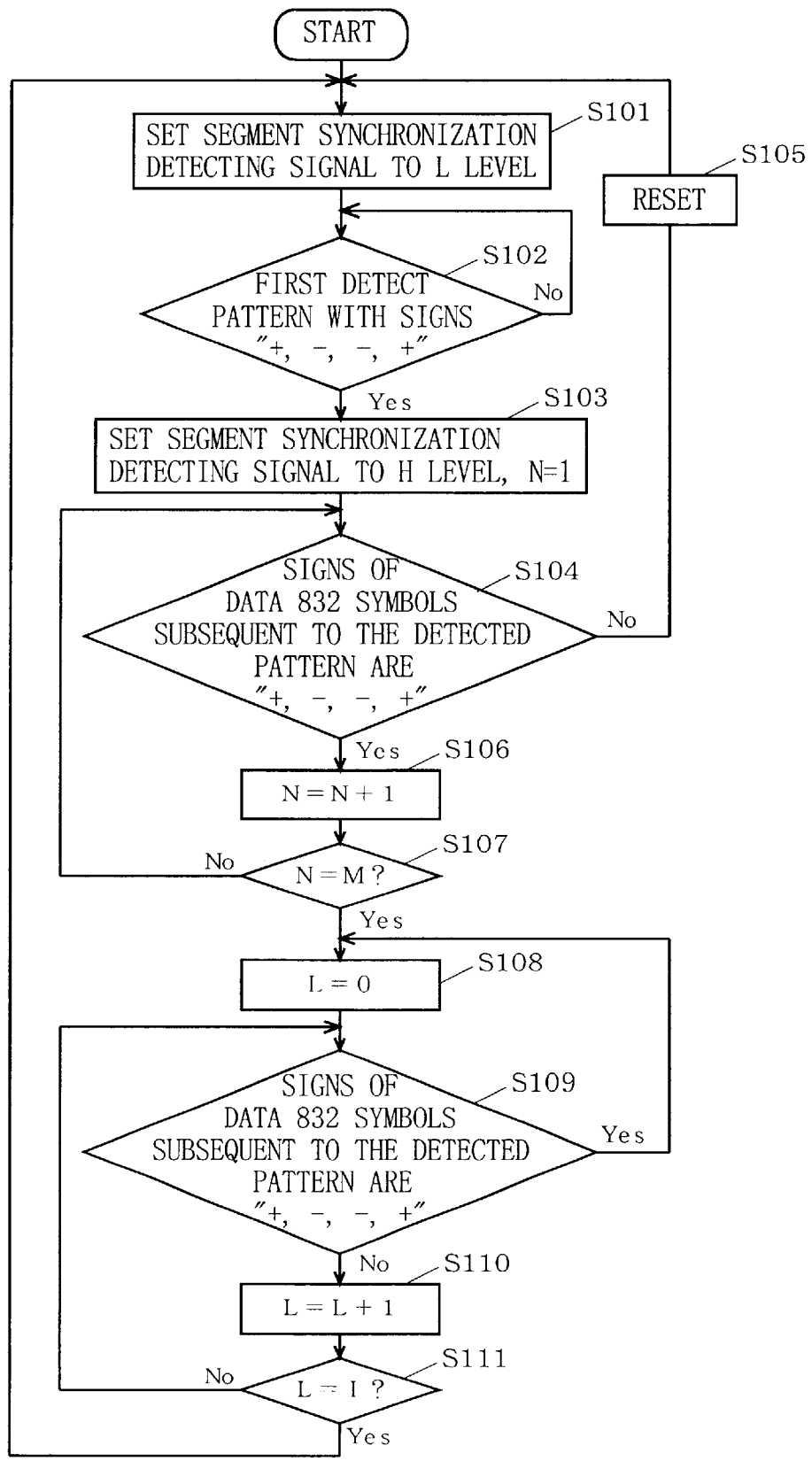
FIG. 5 is a flow chart showing the procedure for segment synchronization detection performed by a segment synchronization detecting circuit 28 shown in FIG. 4.

A segment synchronization detecting method which is carried out by the segment synchronization detecting circuit 28 will be described while further referring to FIG. 5. FIG. 5 is a flow chart showing the procedure for the segment synchronization detection which is performed by the segment synchronization detecting circuit 28.

The segment synchronization detecting circuit 28 first initializes the segment synchronization detecting signal 30 to a low level "L" when a segment synchronization detecting operation is started (step S101). The segment synchronization detecting circuit 28 then judges whether or not a pattern of symbol data with signs "+, −, −, +" is detected (step S102). When the pattern is detected in the judgment at the step S102, the segment synchronization detecting circuit 28 sets the segment synchronization detecting signal 30 to a high level "H", and sets the number of times N a segment synchronous pattern has been detected to "1" (step S103). The segment synchronization detecting circuit 28 judges whether or not the signs of symbol data 832 symbols subsequent to the pattern of the symbol data with signs "+, −, −, +" first detected at the step S102 are similarly "+, −, −, +" (step S104). When the pattern is detected by the judgment at the step S104, the segment synchronization detecting circuit 28 increments the value of the number of times N a segment synchronous pattern has been detected by one (step S106). The procedure at the steps S104 and S106 is repeated until N=M (M is the number of times a segment synchronous pattern has been detected which is to be determination that a segment synchronizing signal has been detected, and is previously arbitrarily determined), so that segment synchronization detection is determined (step S107). When the pattern cannot be detected in the judgment at the step S104, the segment synchronization detecting circuit 28 resets the number of times N a segment synchronous pattern has been detected (step S105), and starts to detect the pattern of the symbol data with signs "+, −, −, +" from the beginning again.

Even after the number of times N a segment synchronous pattern has been detected reaches M, so that the segment synchronization detection is determined, the segment synchronization detecting circuit 28 also continuously judges whether or not the signs of symbol data 832 symbols subsequent to the pattern detected at the step S102 are respectively "+, −, −, +" (step S109). When the pattern is not detected in the judgment at the step S109, the segment synchronization detecting circuit 28 increments the value of the number of times L a segment synchronous pattern is not detected, which is initialized at the step S108, by one (step S110). When the procedure at the steps S109 to S110 is repeated, so that L=I (I is the number of times a segment synchronous pattern is not detected which is to be determination that a segment synchronizing signal is not detected, and is previously arbitrarily determined), the segment synchronization detecting circuit 28 judges that the segment synchronization detection proceeds from the state where it is determined to a state where it is not determined. Therefore, the program is returned to the step S101, to perform processing for determining segment synchronization detection again (step S111).

The gain detector 25 outputs to the amplifier 26 a judgment signal for controlling the gain of the VSB detector 3 such that the level of the segment synchronizing signal 20 in the digital data outputted by the AD converter 4 takes a value from −5 to +5 which is a reference level (which is determined by the ATSC standard). Specifically, the gain detector 25 outputs a judgment signal for increasing the gain of the VSB detector 3 when the level of the segment synchronizing signal 20 detected in the segment synchronization detecting circuit 28 is lower than the level of −5 to +5 (for example, −3 to +3), while outputting a judgment signal for decreasing the gain of the VSB detector 3 when it is higher (for example, −7 to +7).

The amplifier 26 receives the judgment signal which is outputted by the gain detector 25, subjects the judgment signal to predetermined amplification, and then outputs the amplified judgment signal to the wide-band loop filter 32 and the narrow-band loop filter 33.

A filter coefficient is set in the wide-band loop filter 32 such that the loop gain of the AGC circuit 7 is higher (the following properties of AGC are better), that is, a reduction of a time period required to detect the segment synchronizing signal 20 takes priority over a ghost disturbance removal performance. On the other hand, a filter coefficient is set in the narrow-band loop filter 33 such that the loop gain of the AGC circuit 7 is lower (the following properties of AGC are worse), that is, the ghost disturbance removal performance takes priority over the reduction of the time period required to detect the segment synchronizing signal 20.

The judgment signal after the amplification which is outputted by the amplifier 26 is inputted to the switching circuit 34 after respectively passing through the wide-band loop filter 32 and the narrow-band loop filter 33.

The switching circuit 34 receives the signals which have respectively passed through the wide-band loop filter 32 and the narrow-band loop filter 33 and the segment synchronization detecting signal 30 from the segment synchronization detecting circuit 28. In accordance with the segment synchronization detecting signal 30, the switching circuit 34 selects the signal which has passed through the wide-band loop filter 32 when the segment synchronization detecting signal 30 is at an "L" level (the segment synchronizing signal 20 is not detected), while selecting the signal which has passed through the narrow-band loop filter 33 when the segment synchronization detecting signal 30 is at an "H" level (the segment synchronizing signal 20 is detected), and feeds back the selected signal to the VSB detector 3 as an AGC voltage 8.

Results by specific experiments are shown herein. In the experiments, the loop gain of the AGC circuit 7 is set to high loop gain-low loop gain ratio of 5:1.

Time periods required to detect the segment synchronizing signal 20 in a case where the loop gain of the AGC circuit 7 is made high and in a case where the loop gain of the AGC circuit 7 is made low with respect to a signal including no ghost signal (the average value from 20 measurements, the same is true for the following) are respectively 0.35 seconds and 0.31 seconds, between which there is little difference. On the other hand, time periods required to detect the segment synchronizing signal 20 in a case where the loop gain of the AGC circuit 7 is made high and in a case where the loop gain of the AGC circuit is made low with respect to a signal including a ghost signal of 1 $\mu$sec and D/U=6 dB are respectively 4.5 seconds and 6.5 seconds. The time period required to detect the segment synchronizing signal 20 in a case where the loop gain is made high thus becomes shorter.

Although the ghost disturbance removal performance of the ghost signal of 1 $\mu$sec is D/U=13 dB when the loop gain of the AGC circuit 7 is fixed at a large value, it is D/U=8 dB when the loop gain of the AGC circuit 7 is switched from a large value to a small value before and after the segment synchronizing signal 20 is detected. D indicates a desired wave (Desire), and U indicates an undesired wave (Undesire). As D/U becomes smaller, the level of the ghost signal becomes larger.

As described in the foregoing, in the VSB receiver according to the first embodiment of the present invention, the loop filter is switched to a wide band until the segment synchronizing signal 20 is detected such that the time period required for the detection is shortened, while being switched to a narrow band in order to improve the ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Second Embodiment

Figure 6:
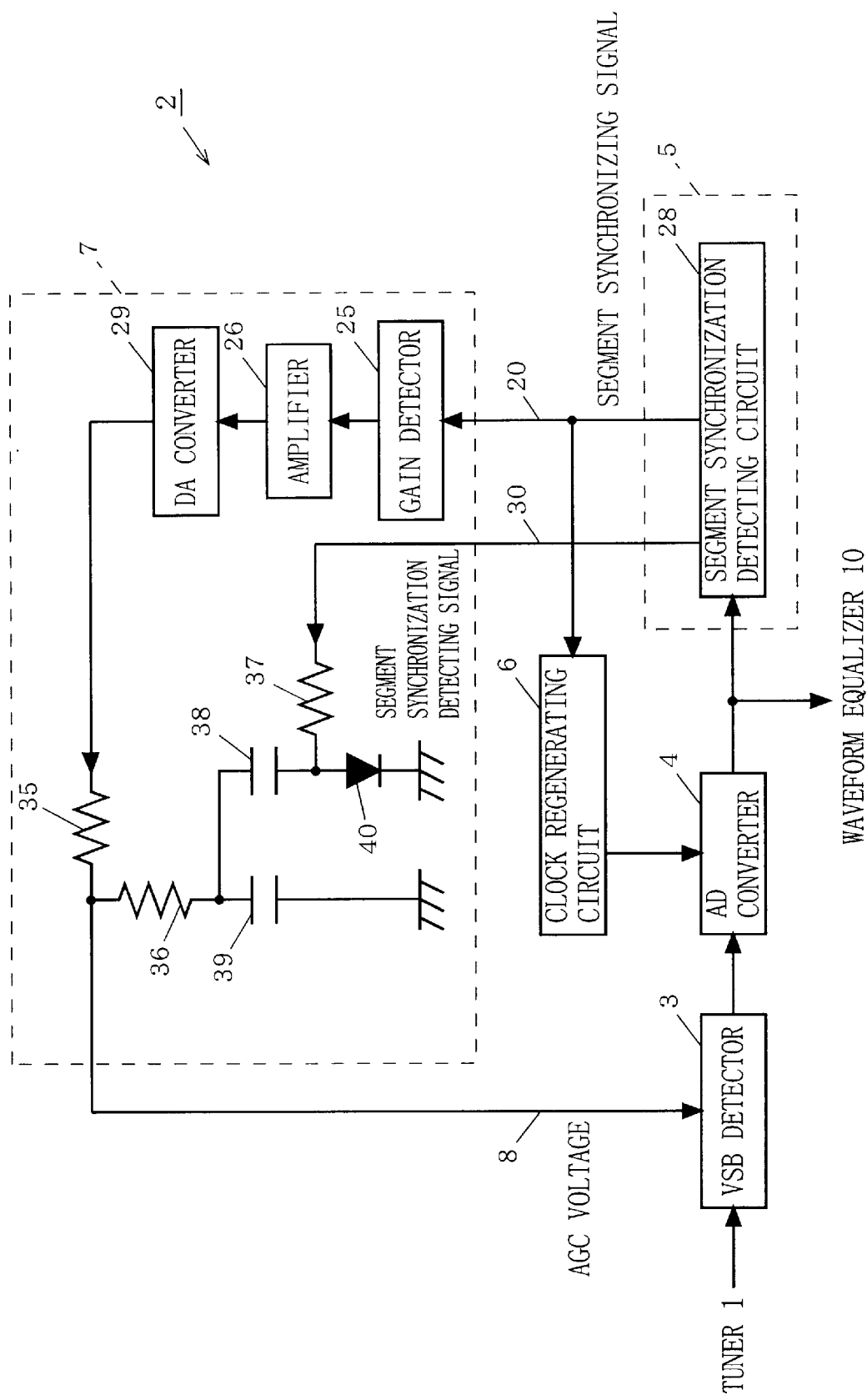
FIG. 6 is a block diagram showing the configuration of a digital demodulation portion 2 in a VSB receiver according to a second embodiment of the present invention.

FIG. 6 is a block diagram showing the configuration of a digital demodulation portion 2 in a VSB receiver according to a second embodiment of the present invention. In FIG. 6, the digital demodulation portion 2 in the second embodiment comprises a VSB detector 3, an AD converter 4, a segment synchronization detecting circuit 28, a gain detector 25, an amplifier 26, a DA converter 29, resistors 35 to 37, capacitors 38 and 39, a switching diode 40, and a clock regenerating circuit 6.

As shown in FIG. 6, in the digital demodulation portion 2 in the second embodiment, the synchronization detecting circuit 5 shown in FIG. 1 is constituted by the segment synchronization detecting circuit 28, and the AGC circuit 7 shown in FIG. 1 is constituted by the gain detector 25, the amplifier 26, the DA converter 29 and a discrete circuit comprising the resistors 35 to 37, the capacitors 38 and 39, and the switching diode 40. In FIG. 6, the same constituent elements as those shown in FIGS. 1 and 4 are assigned the same reference numerals and hence, the description thereof is not repeated.

The constituent elements in the digital demodulation portion 2 in the second embodiment will be successively described.

The DA converter 29 receives a digital judgment signal after amplification which is outputted by the amplifier 26, converts the digital judgment signal into an analog judgment signal, and outputs the analog judgment signal. The signal outputted from the DA converter 29 is inputted to one terminal of the resistor 35 in the discrete circuit. The other terminal of the resistor 35 is connected to one terminal of the resistor 36, and is connected to the VSB detector 3 by feedback. The other terminal of the resistor 36 is connected to respective one terminals of the capacitors 38 and 39. The other terminal of the capacitor 38 is connected to an anode terminal of the switching diode 40 and one terminal of the resistor 37. The other terminal of the capacitor 39 and a cathode terminal of the switching diode 40 are respectively grounded. A segment synchronization detecting signal 30 outputted by the segment synchronization detecting circuit 28 is inputted to the other terminal of the resistor 37.

First, the segment synchronization detecting signal 30 is at an "L" level until a segment synchronizing signal 20 is detected, so that the switching diode 40 is turned off. Consequently, in this case, the discrete circuit functions as a wide-band loop filter comprising the resistors 35 and 36 and the capacitor 39.

After the segment synchronizing signal 20 is then detected, the segment synchronization detecting signal 30 is brought into an "H" level, so that the switching diode 40 is turned on. Consequently, in this case, the discrete circuit functions as a narrow-band loop filter comprising the resistors 35 and 36 and the capacitors 38 and 39.

As an AGC voltage 8 fed back to the VSB detector 3 from the other terminal of the resistor 35, therefore, the AGC voltage 8 which has passed through the wide-band loop filter and the AGC voltage 8 which has passed through the narrow-band loop filter are selected and are outputted in accordance with the segment synchronization detecting signal 30, respectively, when the segment synchronizing signal 20 is not detected and when the segment synchronizing signal 20 is detected.

As described in the foregoing, in the VSB receiver according to the second embodiment of the present invention, the loop filter is switched to a wide band until the segment synchronizing signal 20 is detected such that a time period required for the detection is shortened, while being switched to a narrow band in order to improve a ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Third Embodiment

Figure 7:
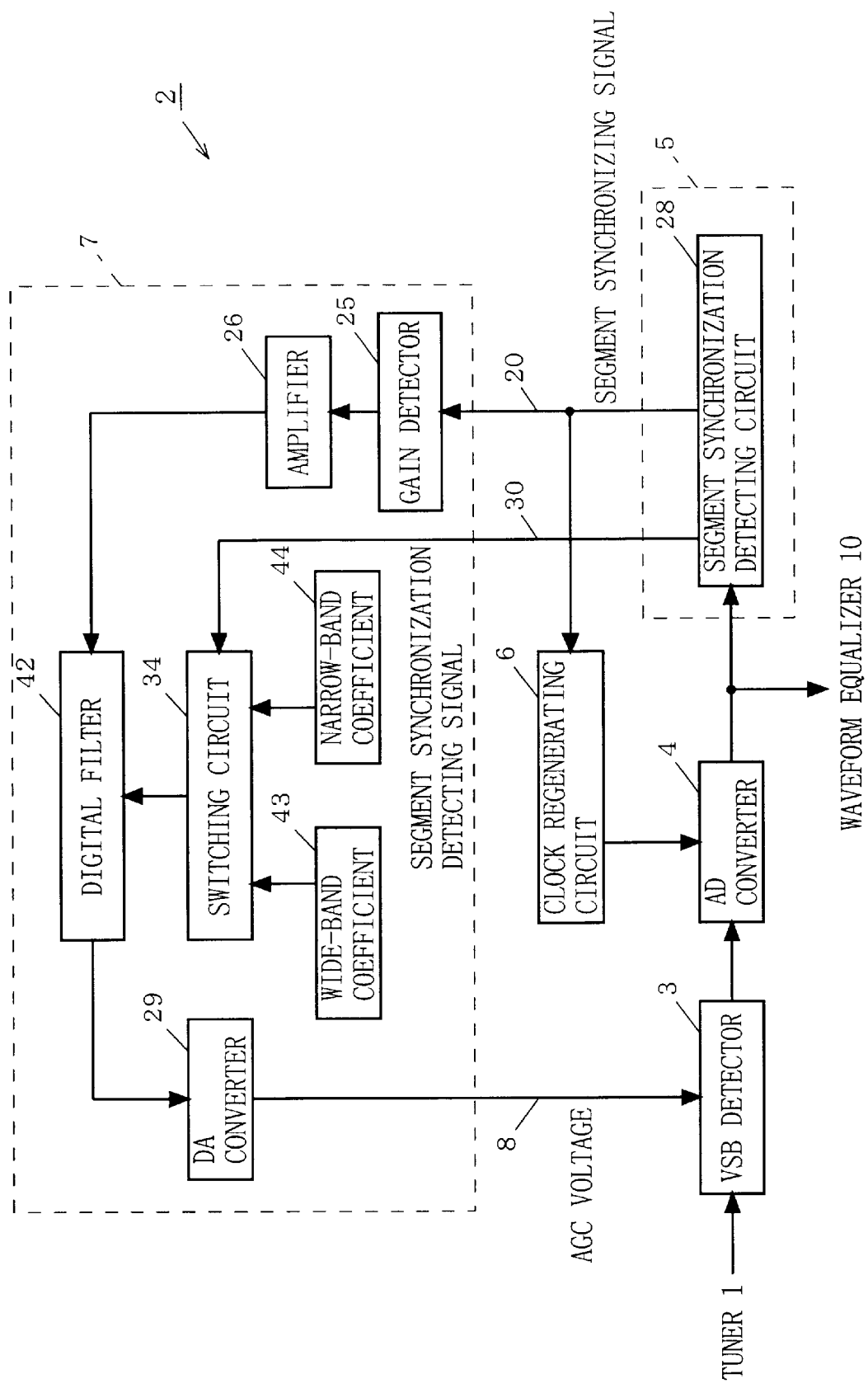
FIG. 7 is a block diagram showing the configuration of a digital demodulation portion 2 in a VSB receiver according to a third embodiment of the present invention.

FIG. 7 is a block diagram showing the configuration of a digital demodulation portion 2 in a VSB receiver according to a third embodiment of the present invention. In FIG. 7, the digital demodulation portion 2 in the third embodiment comprises a VSB detector 3, an AD converter 4, a segment synchronization detecting circuit 28, a gain detector 25, an amplifier 26, a digital filter 42, a switching circuit 34, a wide-band coefficient 43, a narrow-band coefficient 44, a DA converter 29, and a clock regenerating circuit 6.

As shown in FIG. 7, in the digital demodulation portion 2 in the third embodiment, the synchronization detecting circuit 5 shown in FIG. 1 is constituted by the segment synchronization detecting circuit 28, and the AGC circuit 7 shown in FIG. 1 is constituted by the gain detector 25, the amplifier 26, the digital filter 42, the switching circuit 34, the wide-band coefficient 43, the narrow-band coefficient 44, and the DA converter 29. In FIG. 7, the same constituent elements as those shown in FIGS. 1 and 4 are assigned the same reference numerals and hence, the description thereof is not repeated.

The constituent elements in the digital demodulation portion 2 in the third embodiment will be successively described.

A digital judgment signal after amplification which is outputted by the amplifier 26 is subjected to filtering in the digital filter 42, and is converted into an analog AGC voltage 8 in the DA converter 29. Thereafter, the analog AGC voltage 8 is fed back to the VSB detector 3.

The wide-band coefficient 43 stores a filter coefficient required for the digital filter 42 to function in a wide band.

The narrow-band coefficient 44 stores a filter coefficient required for the digital filter 42 to function in a narrow band.

In accordance with a segment synchronization detecting signal 30, the switching circuit 34 writes the wide-band coefficient 43 into the digital filter 42 when the segment synchronization detecting signal 30 is at an "L" level (a segment synchronizing signal 20 is not detected), while writing the narrow-band coefficient 44 into the digital filter 42 when the segment synchronization detecting signal 30 is at an "H" level (the segment synchronizing signal 20 is detected).

Accordingly, the digital filter 42 functions as a wide-band loop filter when the segment synchronizing signal 20 is not detected, while functioning as a narrow-band loop filter when the segment synchronizing signal 20 is detected. Consequently, the AGC voltage 8 fed back- to the VSB detector 3 is outputted after the band thereof is selectively switched in accordance with the segment synchronization detecting signal 30.

As described in the foregoing, in the VSB receiver according to the third embodiment of the present invention, the loop filter is switched to a wide band until the segment synchronizing signal 20 is detected such that a time period required for the detection is shortened, while being switched to a narrow band in order to improve a ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Fourth Embodiment

Figure 8:
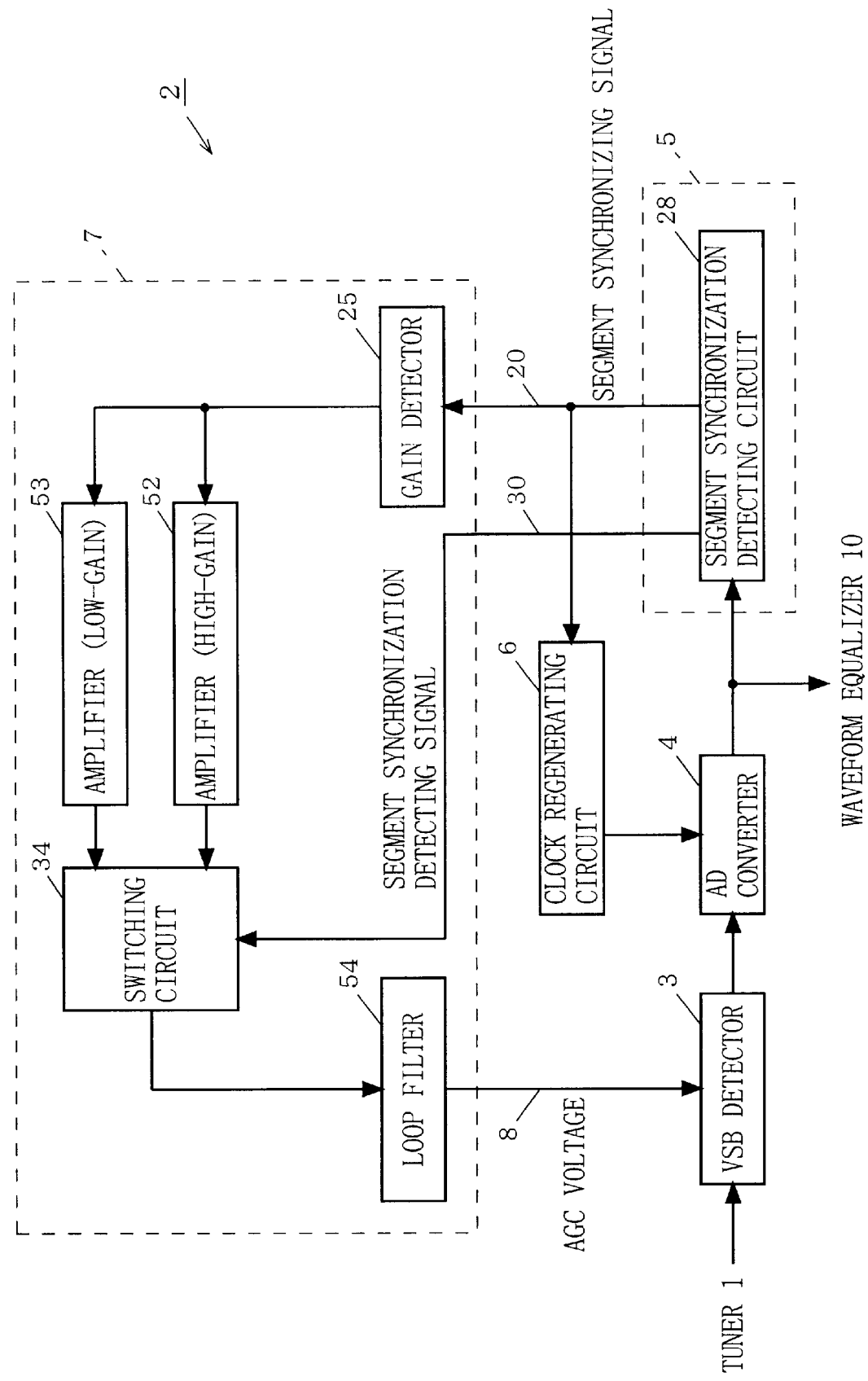
FIG. 8 is a block diagram showing the configuration of a digital demodulation portion 2 in a VSB receiver according to a fourth embodiment of the present invention.

FIG. 8 is a block diagram showing the configuration of a digital demodulation portion 2 in a VSB receiver according to a fourth embodiment of the present invention. In FIG. 8, the digital demodulation portion 2 in the fourth embodiment comprises a VSB detector 3, an AD converter 4, a segment synchronization detecting circuit 28, a gain detector 25, an amplifier (high-gain) 52, an amplifier (low-gain) 53, a switching circuit 34, a loop filter 54, and a clock regenerating circuit 6.

As shown in FIG. 8, in the digital demodulation portion 2 in the fourth embodiment, the synchronization detecting circuit 5 shown in FIG. 1 is constituted by the segment synchronization detecting circuit 28, and the AGC circuit 7 shown in FIG. 1 is constituted by the gain detector 25, the amplifier (high-gain) 52, the amplifier (low-gain) 53, the switching circuit 34, and the loop filter 54. In FIG. 8, the same constituent elements as those shown in FIGS. 1 and 4 are assigned the same reference numerals and hence, the description thereof is not repeated.

The constituent elements in the digital demodulation portion 2 in the fourth embodiment will be successively described.

A judgment signal outputted by the gain detector 25 is inputted to the amplifier (high-gain) 52 and the amplifier (low-gain) 53, respectively.

An amplitude gain value is set in the amplifier (high-gain) 52 such that the loop gain of the AGC circuit 7 is higher (the following properties of AGC are better), that is, a reduction of a time period required to detect a segment synchronizing signal 20 takes priority over a ghost disturbance removal performance. On the other hand, an amplitude gain value is set in the amplifier (low-gain) 53 such that the loop gain of the AGC circuit 7 is lower (the following properties of AGC are worse), that is, the ghost disturbance removal performance takes priority over the reduction of the time period required to detect the segment synchronizing signal 20.

A judgment signal outputted by the gain detector 25 is thus inputted to the switching circuit 34 after being respectively amplified by the amplifier (high-gain) 52 and the amplifier (low-gain) 53.

The switching circuit 34 receives the signals respectively amplified by the amplifier (high-gain) 52 and the amplifier (low-gain) 53 and a segment synchronization detecting signal 30 from the segment synchronization detecting circuit 28. In accordance with the segment synchronization detecting signal 30, the switching circuit 34 selects the signal amplified by the amplifier (high-gain) 52 when the segment synchronization detecting signal 30 is at an "L" level (the segment synchronizing signal 20 is not detected), while selecting the signal amplified by the amplifier (low-gain) 53 when the segment synchronization detecting signal 30 is at an "H" level (the segment synchronizing signal 20 is detected), and outputs the selected signal. The signal selectively outputted from the switching circuit 34 is fed back to the VSB detector 3 as an AGC voltage 8 after passing through the loop filter 54.

As described in the foregoing, in the VSB receiver according to the fourth embodiment of the present invention, the amplitude gain is switched to a large value until the segment synchronizing signal 20 is detected such that a time period required for the detection is shortened, while being switched to a small value in order to improve a ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Fifth Embodiment

Figure 9:
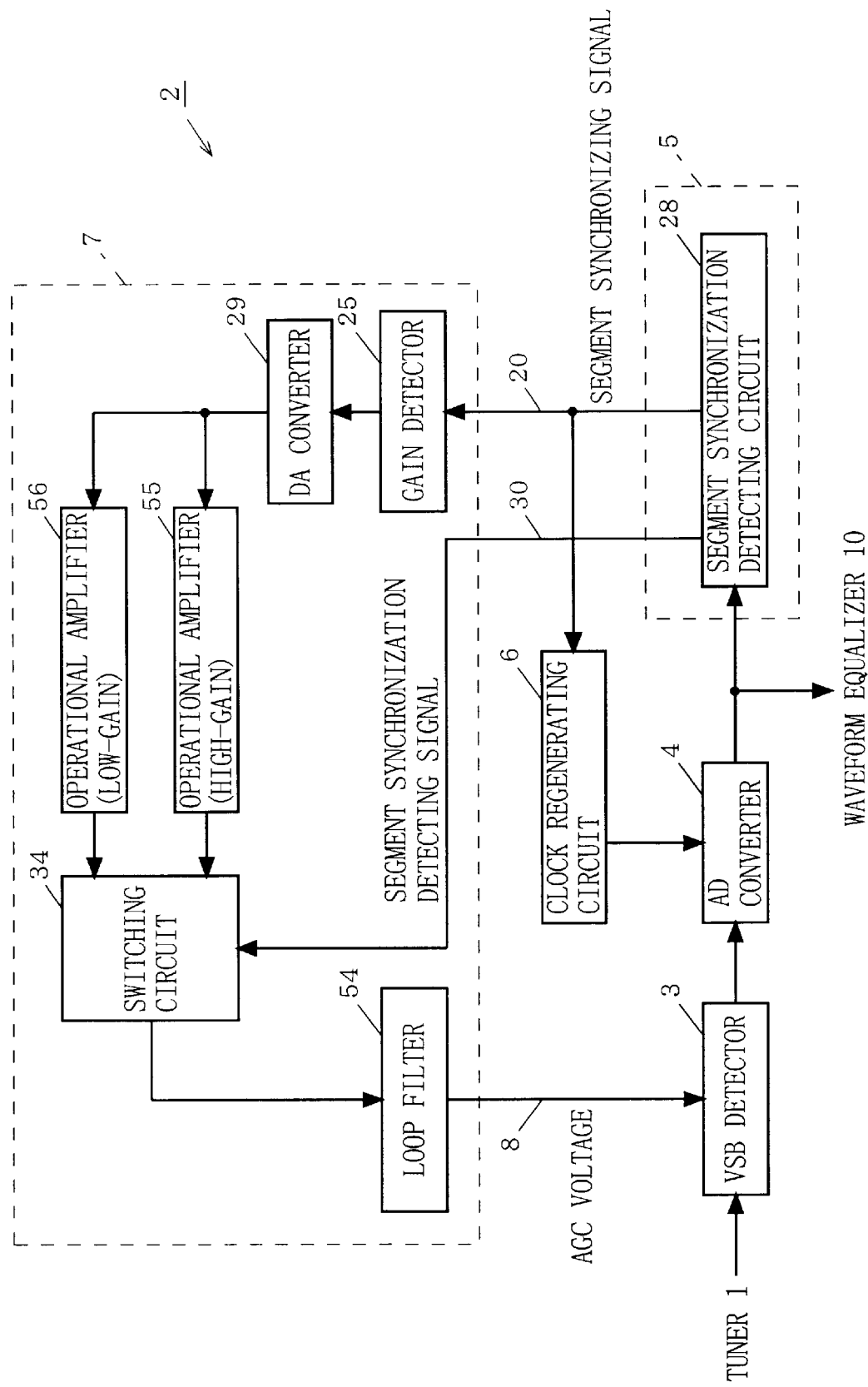
FIG. 9 is a block diagram showing the configuration of a digital demodulation portion 2 in a VSB receiver according to a fifth embodiment of the present invention.

FIG. 9 is a block diagram showing the configuration of a digital demodulation portion 2 in a VSB receiver according to a fifth them embodiment of the present invention. In FIG. 9, the digital demodulation portion 2 in the fifth embodiment comprises a VSB detector 3, an AD converter 4, a segment synchronization detecting circuit 28, a gain detector 25, a DA converter 29, an operational amplifier (high-gain) 55, an operational amplifier (low-gain) 56, a switching circuit 34, a loop filter 54, and a clock regenerating circuit 6.

As shown in FIG. 9, in the digital demodulation portion 2 in the fifth embodiment, the synchronization detecting circuit 5 shown in FIG. 1 is constituted by the, segment synchronization detecting circuit 28, and the AGC circuit 7 shown in FIG. 1 is constituted by the gain detector 25, the DA converter 29, the operational amplifier (high-gain) 55, the operational amplifier (low-gain) 56, the switching circuit 34, and the loop filter 54. In FIG. 9, the same constituent elements as those shown in FIGS. 1 and 4 are assigned the same reference numerals and hence, the description thereof is not repeated.

The constituent elements in the digital demodulation portion 2 in the fifth embodiment will be successively described.

The DA converter 29 receives a digital judgment signal outputted by the gain detector 25, converts the digital judgment signal into an analog judgment signal, and outputs the analog judgment signal. The analog judgment signal is inputted to the operational amplifier (high-gain) 55 and the operational amplifier (low-gain) 56, respectively.

An amplitude gain value is set in the operational amplifier (high-gain) 55 such that the loop gain of the AGC circuit 7 is higher (the following properties of AGC are better), that is, a reduction of a time period required to detect a segment synchronizing signal 20 takes priority over a ghost disturbance removal performance. On the other hand, an amplitude gain value is set in the operational amplifier (low-gain) 56 such that the loop gain of the AGC circuit 7 is lower (the following properties of AGC are worse), that is, the ghost disturbance removal performance takes priority over the reduction of the time period required to detect the segment synchronizing signal 20.

The analog judgment signal outputted by the DA converter 29 is thus inputted to the switching circuit 34 after being respectively amplified by the operational amplifier (high-gain) 55 and the operational amplifier (low-gain) 56.

The switching circuit 34 receives the signals respectively amplified by the operational amplifier (high-gain) 55 and the operational amplifier (low-gain) 56 and a segment synchronization detecting signal 30 from the segment synchronization detecting circuit 28. In accordance with the segment synchronization detecting signal 30, the switching circuit 34 selects the signal amplified by the operational amplifier (high-gain) 55 when the segment synchronization detecting signal 30 is at an "L" level (the segment synchronizing signal 20 is not detected), while selecting the signal amplified by the operational amplifier (low-gain) 56 when the segment synchronization detecting signal 30 is at an "H" level (the segment synchronizing signal 20 is detected), and outputs the selected signal. The signal selectively outputted from the switching circuit 34 is fed back to the VSB detector 3 as an AGC voltage 8 after passing through the loop filter 54.

As described in the foregoing, in the VSB receiver according to the fifth embodiment of the present invention, the amplitude gain is switched to a large value until the segment synchronizing signal 20 is detected such that a time period required for the detection is shortened, while being switched to a small value in order to improve a ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Sixth Embodiment

Figure 10:
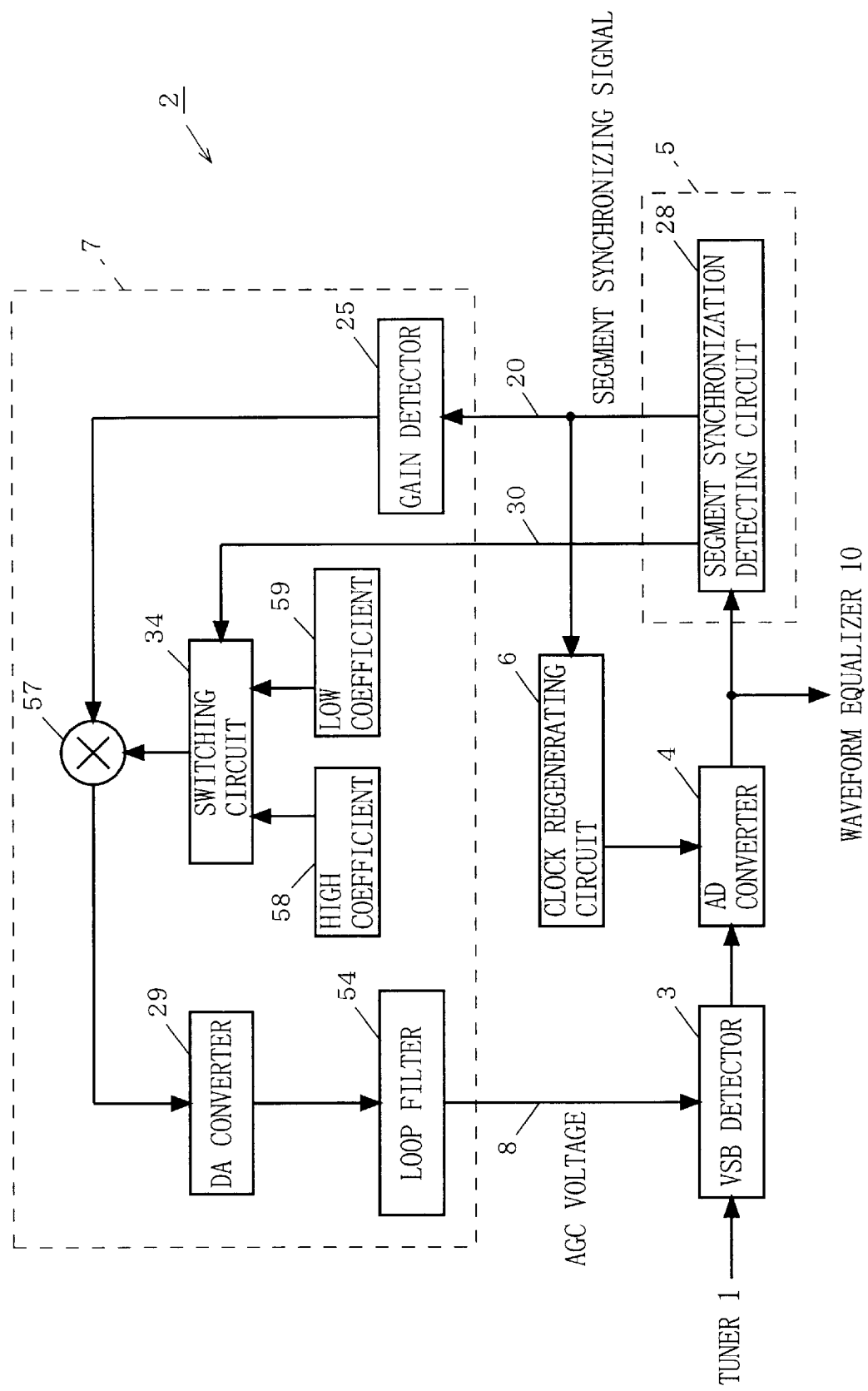
FIG. 10 is a block diagram showing the configuration of a digital demodulation portion 2 in a VSB receiver according to a sixth embodiment of the present invention.

FIG. 10 is a block diagram showing the configuration of a digital demodulation portion 2 in a VSB receiver according to a sixth embodiment of the present invention. In FIG. 10, the digital demodulation portion 2 in the sixth embodiment comprises a VSB detector 3, an AD converter 4, a segment synchronization detecting circuit 28, a gain detector 25, a multiplier 57, a high coefficient 58, a low coefficient 59, a switching circuit 34, a DA converter 29, a loop filter 54, and a clock regenerating circuit 6.

As shown in FIG. 10, in the digital demodulation portion 2 in the sixth embodiment, the synchronization detecting circuit 5 shown in FIG. 1 is constituted by the segment synchronization detecting circuit 28, and the AGC circuit 7 shown in FIG. 1 is constituted by the gain detector 25, the multiplier 57, the high coefficient 58, the low coefficient 59, the switching circuit 34, the DA converter 29, and the loop filter 54. In FIG. 10, the same constituent elements as those shown in FIGS. 1 and 4 are assigned the same reference numerals and hence, the description thereof is not repeated.

The constituent elements in the digital demodulation portion 2 in the sixth embodiment will be successively described.

A digital judgment signal outputted by the gain detector 25 is amplified in the multiplier 57, and is converted into an analog AGC voltage 8 in the DA converter 29. Thereafter, the analog AGC voltage 8 is fed back to the VSB detector 3.

The high coefficient 58 stores a coefficient required to increase the amplitude gain of the multiplier 57. The low coefficient 59 stores a coefficient required to decrease the amplitude gain of the multiplier 57.

In accordance with a segment synchronization detecting signal 30, the switching circuit 34 inputs the high coefficient 58 into the multiplier 57 when the segment synchronization detecting signal 30 is at an "L" level (a segment synchronizing signal 20 is not detected), while inputting the low coefficient 59 into the multiplier 57 when the segment synchronization detecting signal 30 is at an "H" level (the segment synchronizing signal 20 is detected).

Accordingly, the multiplier 57 functions as a high-gain amplifier when the segment synchronizing signal 20 is not detected, while functioning as a low-gain amplifier when the segment synchronizing signal 20 is detected. Consequently, the AGC voltage 8 fed back to the VSB detector 3 is outputted after the gain value thereof is selectively switched in accordance with the segment synchronization detecting signal 30.

As described in the foregoing, in the VSB receiver according to the sixth embodiment of the present invention, the amplitude gain is switched to a large value until the segment synchronizing signal 20 is detected such that a time period required for the detection is shortened, while being switched to a small value in order to improve a ghost disturbance removal performance after the segment synchronizing signal 20 is detected, to control the loop gain of the AGC circuit 7.

Even when there is a ghost disturbance in the received signal, therefore, it is possible to shorten the time period required to detect the segment synchronizing signal 20 as well as to improve the ghost disturbance removal performance.

Seventh Embodiment

In the above-mentioned first to sixth embodiments, description was made of the VSB receiver in which the loop gain of the AGC circuit 7 is switched, to shorten the time period required to detect the segment synchronizing signal 20 as well as to improve the ghost disturbance removal performance.

In the following embodiments, description is now made of a VSB receiver capable of more shortening a time period required to detect a segment synchronizing signal 20 as well as more performing accurate clock regeneration also at the time of a ghost disturbance by also switching the loop gain of a clock regenerating circuit 6.

Figure 11:
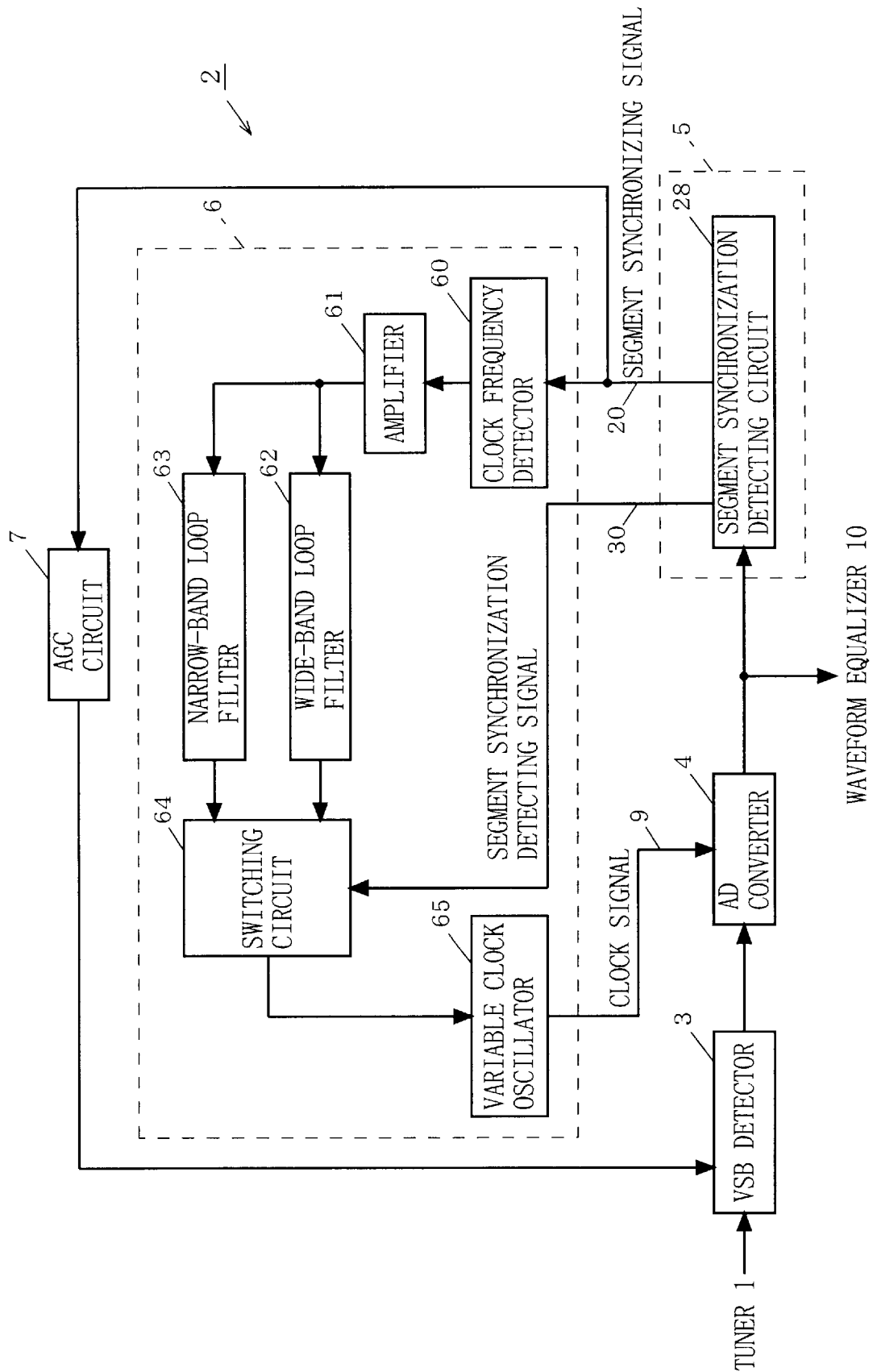
FIG. 11 is a block diagram showing the configuration of a digital demodulation portion 2 in a VSB receiver according to a seventh embodiment of the present invention.

FIG. 11 is a block diagram showing the configuration of a digital demodulation portion 2 in a VSB receiver according to a seventh embodiment of the present invention. In FIG. 11, the digital demodulation portion 2 in the seventh embodiment comprises a VSB detector 3, an AD converter 4, a segment synchronization detecting circuit 28, a clock frequency detector 60, an amplifier 61, a wide-band loop filter 62, a narrow-band loop filter 63, a switching circuit 64, a variable clock oscillator 65, and an AGC circuit 7.

As shown in FIG. 11, in the digital demodulation portion 2 in the seventh embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the amplifier 61, the wide-band loop filter 62, the narrow-band loop filter 63, the switching circuit 64, and the variable clock oscillator 65. In FIG. 11, the same constituent elements as those shown in FIGS. 1 and 4 are assigned the same reference numerals and hence, the description thereof is not repeated. Any one of the configurations in the first to sixth embodiments is used for the AGC circuit 7 in FIG. 11.

The constituent elements in the digital demodulation portion 2 in the seventh embodiment will be successively described.

Digital data (FIG. 2) outputted by the AD converter 4 is inputted to a waveform equalizer 10 and the segment synchronization detecting circuit 28. The segment synchronization detecting circuit 28 subjects the inputted digital data to segment synchronization detection, and outputs to the clock frequency detector 60 a segment synchronizing signal 20 obtained by the detection and outputs to the switching circuit 64 a segment synchronization detecting signal 30 representing the result of judgment whether or not the segment synchronizing signal has been detected.

A segment synchronization detecting method which is carried out by the segment synchronization detecting circuit 28 was described in the first embodiment and hence, the detailed description thereof is not repeated.

The clock frequency detector 60 judges whether the frequency of a clock signal 9 in the VSB receiver is higher or lower than the clock frequency of transmitted data, and outputs its judgment signal to the amplifier 61.

Figure 12A:
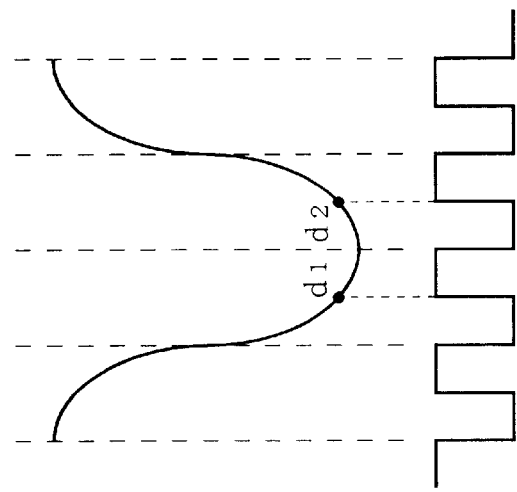
FIG. 12 is a diagram for explaining the concept of a clock frequency judging method which is carried out by a clock frequency detector 60 shown in FIG. 11.
Figure 12B:
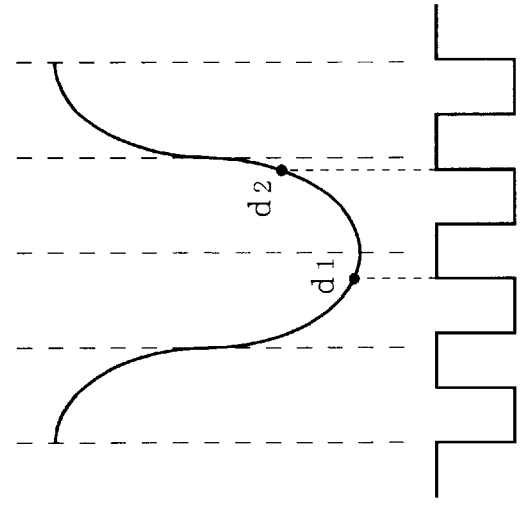
Figure 12C:
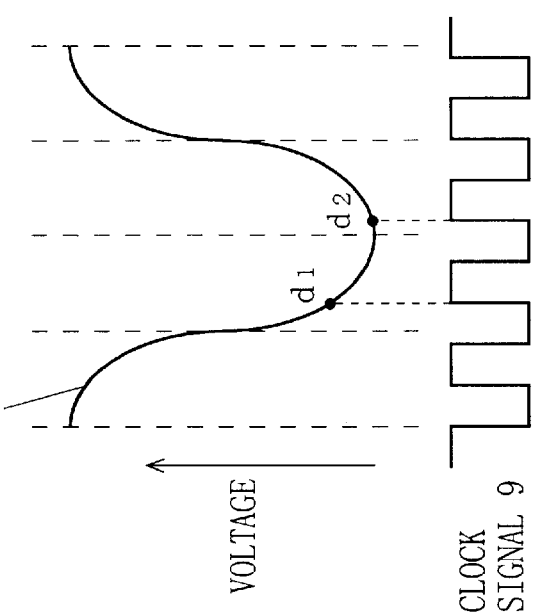

A clock frequency judging method which is carried out by the clock frequency detector 60 will be described while further referring to FIG. 12. FIG. 12 is a diagram for explaining the concept of the clock frequency judging method which is carried out by the clock frequency detector 60.

As a premise, the band of a signal inputted to the AD converter 4 is limited, so that the actual segment synchronizing signal 20 becomes not a rectangular wave in which four symbols are respectively represented by "+5, −5, −5, +5" as shown in FIG. 3 but a wave having a shape shown in FIG. 12.

In a case where the clock signal 9 in the VSB receiver is higher than the clock frequency of the transmitted data (FIG. 12 (a)), when symbol data represented by "−5, −5" in the segment synchronizing signal 20 are converted at the timing of the rising of the clock signal 9 in the VSB receiver in the AD converter 4, the data are respectively converted into digital data d1 and d2 (d1>d2). Conversely, in a case where the clock signal 9 in the VSB receiver is lower than the clock frequency of the transmitted data (FIG. 12 (b)), when the symbol data represented by "−5, −5" in the segment synchronizing signal 20 are converted at the timing of the rising of the clock signal 9 in the VSB receiver in the AD converter 4, the data are respectively converted into digital data d1 and d2 (d1<d2).

The clock frequency detector 60 judges the difference between the two data (d1>d2 or d1<d2), and outputs a judgment signal such that the clock signal 9 in which there is no difference between the two data in the output of the AD converter 4 (d1=d2) is outputted from the variable clock oscillator 65.

By this processing, in a case where the clock signal 9 in the VSB receiver and the clock frequency of the transmitted data coincide with each other (FIG. 12 (c)), when the symbol data represented by "−5, −5" of the segment synchronizing signal 20 are converted at the timing of the rising of the clock signal 9 in the VSB receiver in the AD converter 4, they are respectively converted into digital data d1 and d2 having the same value (d1=d2).

The amplifier 61 receives a judgment signal which is outputted by the clock frequency detector 60, subjects the judgment signal to predetermined amplification, and outputs the amplified judgment signal to the wide-band loop filter 62 and the narrow-band loop filter 63.

A filter coefficient is set in the wide-band loop filter 62 such that the loop gain of the clock regenerating circuit 6 is higher (the following properties of clock regeneration are better), that is, a reduction of a time period required to detect the segment synchronizing signal 20 takes priority over accurate clock regeneration (that is, a ghost disturbance removal performance). On the other hand, a filter coefficient is set in the narrow-band loop filter 63 such that the loop gain of the clock regenerating circuit 6 is lower (the following properties of clock regeneration are worse), that is, the accurate clock regeneration takes priority over the reduction of the time period required to detect the segment synchronizing signal 20.

The judgment signal after the amplification which is outputted by the amplifier 61 is inputted to the switching circuit 64 after respectively passing through the wide-band loop filter 62 and the narrow-band loop filter 63.

The switching circuit 64 receives the signals which have respectively passed through the wide-band loop filter 62 and the narrow-band loop filter 63 and the segment synchronization detecting signal 30 from the segment synchronization detecting circuit 28. In accordance with the synchronization detecting signal 30, the switching circuit 64 selects the signal which has passed through the wide-band loop filter 62 when the segment synchronization detecting signal 30 is at an "L" level (the segment synchronizing signal 20 is not detected), while selecting the signal (a DC voltage) which has passed through the narrow-band loop filter 63 when the segment synchronization detecting signal 30 is at an "H" level (the segment synchronizing signal 20 is detected), and outputs the selected signal to the variable clock oscillator 65.

The variable clock oscillator 65 varies the frequency of the clock signal 9 which oscillates on the basis of a signal (DC signal) outputted by the switching circuit 64, and feeds back- and outputs the clock signal 9 to the AD converter 4.

As described in the foregoing, in the VSB receiver according to the seventh embodiment of the present invention, in addition to controlling the loop gain of the AGC circuit 7, the loop filter is switched to a wide band until the segment synchronizing signal 20 is detected such that a time period required for the detection is shortened, while being switched to a narrow band in order to perform accurate clock regeneration (that is, improve the ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Eighth Embodiment

FIG. 13 is a block diagram showing the configuration of a digital demodulation portion 2 in a VSB receiver according to an eighth embodiment of the present invention. In FIG. 13, the digital demodulation portion 2 in the eighth embodiment comprises a VSB detector 3, an AD converter 4, a segment synchronization detecting circuit 28, a clock frequency detector 60, an amplifier 61, a DA converter 69, resistors 75 to 77, capacitors 78 and 79, a switching diode 80, a variable clock oscillator 65, and an AGC circuit 7.

As shown in FIG. 13, in the digital demodulation portion 2 in the eighth embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the amplifier 61, the DA converter 69 and a discrete circuit comprising the resistors 75 to 77, the capacitors 78 and 79, and the switching diode 80, and the variable clock oscillator 65. In FIG. 13, the same constituent elements as those shown in FIGS. 1, 4 and 11 are assigned the same reference numerals and hence, the description thereof is not repeated. Any one of the configurations in the first to sixth embodiments is used for the AGC circuit 7 in FIG. 13.

The constituent elements in the digital demodulation portion 2 in the eighth embodiment will be successively described.

The DA converter 69 receives a digital judgment signal after amplification which is outputted by the amplifier 61, converts the digital judgment signal into an analog judgment signal, and outputs the analog judgment signal. The signal outputted by the DA converter 69 is inputted to one terminal of the resistor 75 in the discrete circuit. The other terminal of the resistor 75 is connected to one terminal of the resistor 76, and is outputted to the variable clock oscillator 65. The other terminal of the resistor 76 is connected to respective one terminals of the capacitors 78 and 79. The other terminal of the capacitor 78 is connected to an anode terminal of the switching diode 80 and one terminal of the resistor 77. The other terminal of the capacitor 79 and a cathode terminal of the switching diode 80 are respectively grounded. A segment synchronization detecting signal 30 which is outputted by the segment synchronization detecting circuit 28 is inputted to the other terminal of the resistor 77.

First, the segment synchronization detecting signal 30 is at an "L" level until a segment synchronizing signal 20 is detected, so that the switching diode 80 is turned off. Consequently, in this case, the discrete circuit functions as a wide-band loop filter comprising the resistors 75 and 76 and the capacitor 79.

After the segment synchronizing signal 20 is then detected, the segment synchronization detecting signal 30 is brought into an "H" level, so that the switching diode 80 is turned on. Consequently, in this case, the discrete circuit functions as a narrow-band loop filter comprising the resistors 75 and 76 and the capacitors 78 and 79.

As the clock signal 9 fed back to the AD converter 4 from the other terminal of the resistor 75 through the variable clock oscillator 65, therefore, a judgment signal which has passed through the wide-band loop filter and a judgment signal which has passed through the narrow-band loop filter are selected and are outputted in accordance with the segment synchronization detecting signal 30, respectively, when the segment synchronizing signal 20 is not detected and when the segment synchronizing signal 20 is detected.

Results by specific experiments are shown herein. As the values of the elements, the resistor 35 is 18 kΩ, the resistor 36 is 1 kΩ, the capacitor 38 is 1 μF, and the capacitor 39 is 3.3 μF.

A time period required to detect the segment synchronizing signal 20 in a case where the wide-band loop filter is constituted by only the resistors 75 and 76 and the capacitor 79 without switching the loop filter before and after the segment synchronizing signal 20 is detected is 1.05 seconds (the average value from 20 measurements, the same is true for the following), and a time period required to detect the segment synchronizing signal 20 in a case where the band of the loop filter is switched before and after the segment synchronizing signal 20 is detected is 0.36 seconds.

Although a ghost disturbance removal performance of the ghost signal of 1 μsec is D/U=8 dB when the loop filter in the clock regenerating circuit 6 is fixed in a wide band (that is, when the loop gain of the AGC circuit 7 is only switched), it is further improved to D/U=6 dB when the loop filter in the clock regenerating circuit 6 is switched from a wide band to a narrow band before and after the segment synchronizing signal 20 is detected.

As described in the foregoing, in the VSB receiver according to the eighth embodiment of the present invention, in addition to controlling the loop gain of the AGC circuit 7, the loop filter is switched to a wide band until the segment synchronizing signal 20 is detected such that a time period required for the detection is shortened, while being switched to a narrow band in order to perform accurate clock regeneration (that is, improve the ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Ninth Embodiment

FIG. 14 is a block diagram showing the configuration of a digital demodulation portion 2 in a VSB receiver according to a ninth embodiment of the present invention. In FIG. 14, the digital demodulation portion 2 in the ninth embodiment comprises a VSB detector 3, an AD converter 4, a segment synchronization detecting circuit 28, a clock frequency detector 60, an amplifier 61, a digital filter 82, a switching circuit 64, a wide-band coefficient 83, a narrow-band coefficient 84, a DA converter 69, a variable clock oscillator 65, and an AGC circuit 7.

As shown in FIG. 14, in the digital demodulation portion 2 in the ninth embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the amplifier 61, the digital filter 82, the switching circuit 64, the wide-band coefficient 83, the narrow-band coefficient 84, the DA converter 69, and the variable clock oscillator 65. In FIG. 14, the same constituent elements as those shown in FIGS. 1, 4, and 11 are assigned the same reference numerals and hence, the description thereof is not repeated. Any one of the configurations in the first to sixth embodiments is used for the AGC circuit 7 in FIG. 14.

The constituent elements in the digital demodulation portion 2 in the ninth embodiment will be successively described.

A digital judgment signal after amplification which is outputted by the amplifier 61 is subjected to filtering in the digital filter 82, and is converted into an analog signal (a DC voltage) in the DA converter 69. Thereafter, the analog signal is fed back as a clock signal 9 to the AD converter 4 through the variable clock oscillator 65.

The wide-band coefficient 83 stores a filter coefficient required for the digital filter 82 to function in a wide band. The narrow-band coefficient 84 stores a filter coefficient required for the digital filter 82 to function in a narrow band.

In accordance with a segment synchronization detecting signal 30, the switching circuit 64 writes the wide-band coefficient 83 into the digital filter 82 when the segment synchronization detecting signal 30 is at an "L" level (a segment synchronizing signal 20 is not detected), while writing the narrow-band coefficient 84 into the digital filter 82 when the segment synchronization detecting signal 30 is at an "H" level (the segment synchronizing signal 20 is detected).

Accordingly, the digital filter 82 functions as a wide-band loop filter when the segment synchronizing signal 20 is not detected, while functioning as a narrow-band loop filter when the segment synchronizing signal 20 is detected. Consequently, the clock signal 9 fed back to the AD converter 4 is outputted after the band thereof is selectively switched in accordance with the segment synchronization detecting signal 30.

As described in the foregoing, in the VSB receiver according to the ninth embodiment of the present invention, in addition to controlling the loop gain of the AGC circuit 7, the loop filter is switched to a wide band until the segment synchronizing signal 20 is detected such that a time period required for the detection is shortened, while being switched to a narrow band in order to perform accurate clock regeneration (that is, in order to improve a ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Tenth Embodiment

FIG. 15 is a block diagram showing the configuration of a digital demodulation portion 2 in a VSB receiver according to a tenth embodiment of the present invention. In FIG. 15, the digital demodulation portion 2 in the tenth embodiment comprises a VSB detector 3, an AD converter 4, a segment synchronization detecting circuit 28, a clock frequency detector 60, an amplifier (high-gain) 92, an amplifier (low-gain) 93, a switching circuit 64, a loop filter 94, a variable clock oscillator 65, and an AGC circuit 7.

As shown in FIG. 15, in the digital demodulation portion 2 in the tenth embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the amplifier (high-gain) 92, the amplifier (low-gain) 93, the switching circuit 64, the loop filter 94, and the variable clock oscillator 65. In FIG. 15, the same constituent elements as those shown in FIGS. 1, 4 and 11 are assigned the same reference numerals and hence, the description thereof is not repeated. Any one of the configurations in the first to sixth embodiments is used for the AGC circuit 7 in FIG. 15.

The constituent elements in the digital demodulation portion 2 in the tenth embodiment will be successively described.

A judgment signal outputted by the clock frequency detector 60 is inputted to the amplifier (high-gain) 92 and the amplifier (low-gain) 93, respectively.

An amplitude gain value is set in the amplifier (high-gain) 92 such that the loop gain of the clock regenerating circuit 6 is higher (the following properties of clock regeneration are better), that is, a reduction of a time period required to detect a segment synchronizing signal 20 takes priority over accurate clock reproduction (that is, a ghost disturbance removal performance). On the other hand, an amplitude gain value is set in the amplifier (low-gain) 93 such that the loop gain of the clock regenerating circuit 6 is lower (the following properties of clock regeneration are worse), that is, the accurate clock regeneration takes priority over the reduction of the time period required to detect the segment synchronizing signal 20.

A judgment signal outputted by the clock frequency detector 60 is thus inputted to the switching circuit 64 after being respectively amplified by the amplifier (high-gain) 92 and the amplifier (low-gain) 93.

The switching circuit 64 receives the signals respectively amplified by the amplifier (high-gain) 92 and the amplifier (low-gain) 93 and a segment synchronization detecting signal 30 from the segment synchronization detecting circuit 28. In accordance with the segment synchronization detecting signal 30, the switching circuit 64 selects the signal amplified by the amplifier (high-gain) 92 when the segment synchronization detecting signal 30 is at an "L" level (the segment synchronizing signal 20 is not detected), while selecting the signal amplified by the amplifier (low-gain) 93 when the segment synchronization detecting signal 30 is at an "H" level (the segment synchronizing signal 20 is detected), and outputs the selected signal. The signal (a DC voltage) selectively outputted from the switching circuit 64 is fed back to the AD converter 4 as a clock signal 9 after passing through the loop filter 94 and the variable clock oscillator 65.

As described in the foregoing, in the VSB receiver according to the tenth embodiment of the present invention, the amplitude gain is switched to a large value until the segment synchronizing signal 20 is detected such that a time period required for the detection is shortened, while being switched to a small value in order to perform accurate clock regeneration (that is, improve a ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Eleventh Embodiment

Figure 16:
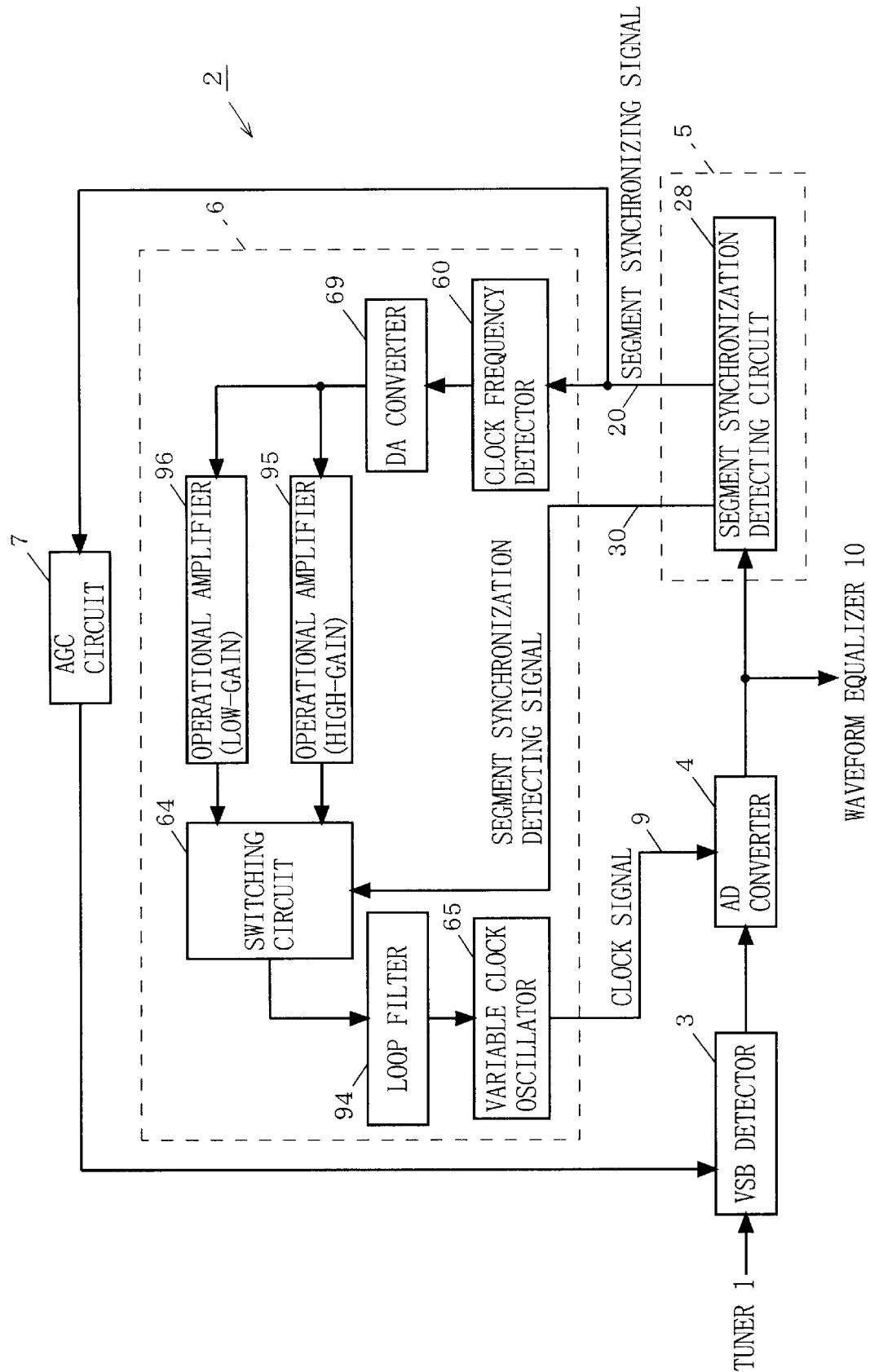
FIG. 16 is a block diagram showing the configuration of a digital demodulation portion 2 in a VSB receiver according to an eleventh embodiment of the present invention.

FIG. 16 is a block diagram showing the configuration of a digital demodulation portion 2 in a VSB receiver according to an eleventh embodiment of the present invention. In FIG. 16, the digital demodulation portion 2 in the eleventh embodiment comprises a VSB detector 3, an AD converter 4, a segment synchronization detecting circuit 28, a clock frequency detector 60, a DA converter 69, an operational amplifier (high-gain) 95, an operational amplifier (low-gain) 96, a switching circuit 64, a loop filter 94, a variable clock oscillator 65, and an AGC circuit 7.

As shown in FIG. 16, in the digital demodulation portion 2 in the eleventh embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the DA converter 69, the operational amplifier (high-gain) 95, the operational amplifier (low-gain) 96, the switching circuit 64, the loop filter 94, and the variable clock oscillator 65. In FIG. 16, the same constituent elements as those shown in FIGS. 1, 4 and 11 are assigned the same reference numerals and hence, the description thereof is not repeated. Any one of the configurations in the first to sixth embodiments is used for the AGC circuit 7 in FIG. 16.

The constituent elements in the digital demodulation portion 2 in the eleventh embodiment will be successively described.

The DA converter 69 receives a digital judgment signal outputted by the clock frequency detector 60, converts the digital judgment signal into an analog judgment signal, and outputs the analog judgment signal. The analog judgment signal is inputted to the operational amplifier (high-gain) 95 and the operational amplifier (low-gain) 96, respectively.

An amplitude gain value is set in the operational amplifier (high-gain) 95 such that the loop gain of the clock regenerating circuit 6 is higher (the following properties of clock regeneration are better), that is, a reduction of a time period required to detect a segment synchronizing signal 20 takes priority over accurate clock reproduction (that is, a ghost disturbance removal performance). On the other hand, an amplitude gain value is set in the operational amplifier (low-gain) 96 such that the loop gain of the clock regenerating circuit 6 is lower (the following properties of clock regeneration are worse), that is, the ghost disturbance removal performance takes priority over the reduction of the time period required to detect the segment synchronizing signal 20.

The analog judgment signal outputted by the DA converter 69 is thus inputted to the switching circuit 64 after being respectively amplified by the operational amplifier (high-gain) 95 and the operational amplifier (low-gain) 96.

The switching circuit 64 receives the signals respectively amplified by the operational amplifier (high-gain) 95 and the operational amplifier (low-gain) 96 and a segment synchronization detecting signal 30 from the segment synchronization detecting circuit 28. In accordance with the segment synchronization detecting signal 30, the switching circuit 64 selects the signal amplified by the operational amplifier (high-gain) 95 when the segment synchronization detecting signal 30 is at an "L" level (the segment synchronizing signal 20 is not detected), while selecting the signal amplified by the operational amplifier (low-gain) 96 when the segment synchronization detecting signal 30 is at an "H" level (the segment synchronizing signal 20 is detected), and outputs the selected signal. The signal selectively outputted from the switching circuit 64 is fed back to the AD converter 4 as a clock signal 9 after passing through the loop filter 94 and the variable clock oscillator 65.

As described in the foregoing, in the VSB receiver according to the eleventh embodiment of the present invention, in addition to controlling the loop gain of the AGC circuit 7, the amplitude gain is switched to a large value until the segment synchronizing signal 20 is detected such that the time period required for the detection is shortened, while being switched to a small value in order to perform the accurate clock regeneration (in order to improve the ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Twelfth Embodiment

Figure 17:
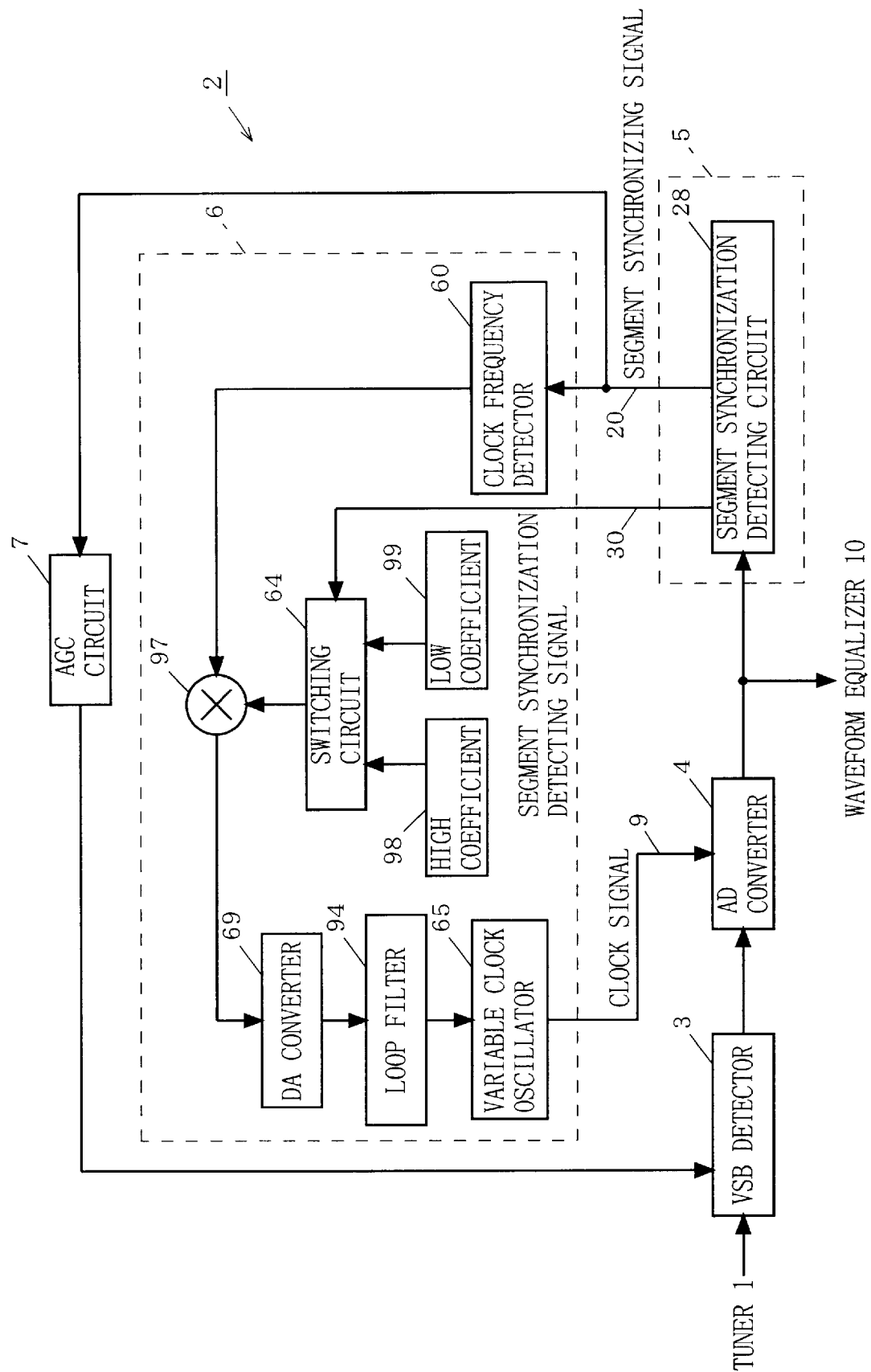
FIG. 17 is a block diagram showing the configuration of a digital demodulation portion 2 in a VSB receiver according to a twelfth embodiment of the present invention.

FIG. 17 is a block diagram showing the configuration of a digital demodulation portion 2 in a VSB receiver according to a twelfth embodiment of the present invention. In FIG. 17, the digital demodulation portion 2 in the twelfth embodiment comprises a VSB detector 3, an AD converter 4, a segment synchronization detecting circuit 28, a clock frequency detector 60, a multiplier 97, a high coefficient 98, a low coefficient 99, a switching circuit 64, a DA converter 69, a loop filter 94, a variable clock oscillator 65, and an AGC circuit 7.

As shown in FIG. 17, in the digital demodulation portion 2 in the twelfth embodiment, the synchronization detecting circuit 5 shown in FIG. 1 is constituted by the segment synchronization detecting circuit 28, and the clock regenerating circuit 6 shown in FIG. 1 is constituted by the clock frequency detector 60, the multiplier 97, the high coefficient 98, the low coefficient 99, the switching circuit 64, the DA converter 69, the loop filter 94, and the variable clock oscillator 65. In FIG. 17, the same constituent elements as those shown in FIGS. 1, 4, and 11 are assigned the same reference numerals and hence, the description thereof is not repeated. Any one of the configurations in the first to sixth embodiments is used for the AGC circuit 7 in FIG. 17.

The constituent elements in the digital demodulation portion 2 in the twelfth embodiment will be successively described.

A digital judgment signal outputted by the clock frequency detector 60 is amplified in the multiplier 97, and is converted into an analog DC voltage in the DA converter 69. Thereafter, the analog DC voltage is fed back to the AD converter 4 through the loop filter 94 and the variable clock oscillator 65.

The high coefficient 98 stores a coefficient required to increase the amplitude gain of the multiplier 97. The low coefficient 99 stores a coefficient required to decrease the amplitude gain of the multiplier 97.

In accordance with a segment synchronization detecting signal 30, the switching circuit 64 inputs the high coefficient 98 into the multiplier 97 when the segment synchronization detecting signal 30 is at an "L" level (a segment synchronizing signal 20 is not detected), while inputting the low coefficient 99 into the multiplier 97 when the segment synchronization detecting signal 30 is at an "LH" level (the segment synchronizing signal 20 is detected).

Accordingly, the multiplier 97 functions as a high-gain amplifier when the segment synchronizing signal 20 is not detected, while functioning as a low-gain amplifier when the segment synchronizing signal 20 is detected. Consequently, the clock signal 9 fed back to the AD converter 4 is outputted after the amplitude value thereof is selectively switched in accordance with the segment synchronization detecting signal 30.

As described in the foregoing, in the VSB receiver according to the twelfth embodiment of the present invention, in addition to controlling the loop gain of the AGC circuit 7, the amplitude gain is switched to a large value until the segment synchronizing signal 20 is detected such that a time period required for the detection is shortened, while being switched to a small value in order to perform accurate clock regeneration (that is, improve a ghost disturbance removal performance) after the segment synchronizing signal 20 is detected, to control the loop gain of the clock regenerating circuit 6.

Even when there is a ghost disturbance in the received signal, therefore, it is possible to shorten the time period required to detect the segment synchronizing signal 20 as well as to improve the ghost disturbance removal performance. Further, no jitter occurs in a regenerated clock in the VSB receiver, so that no error occurs in the received signal.

Thirteenth Embodiment

In the above-mentioned first to twelfth embodiments, the loop gains of the AGC circuit 7 and the clock regenerating circuit 6 are switched using the segment synchronizing signal 20 and the segment synchronization detecting signal 30 which are obtained by performing the segment synchronization detection.

In a thirteenth embodiment, description is made of a VSB receiver in which the loop gains of an AGC circuit 7 and a clock regenerating circuit 6 are switched using field synchronizing signals 21 and 22 and a field synchronization detecting signal 101 which are obtained by performing field synchronization detection.

Figure 18:
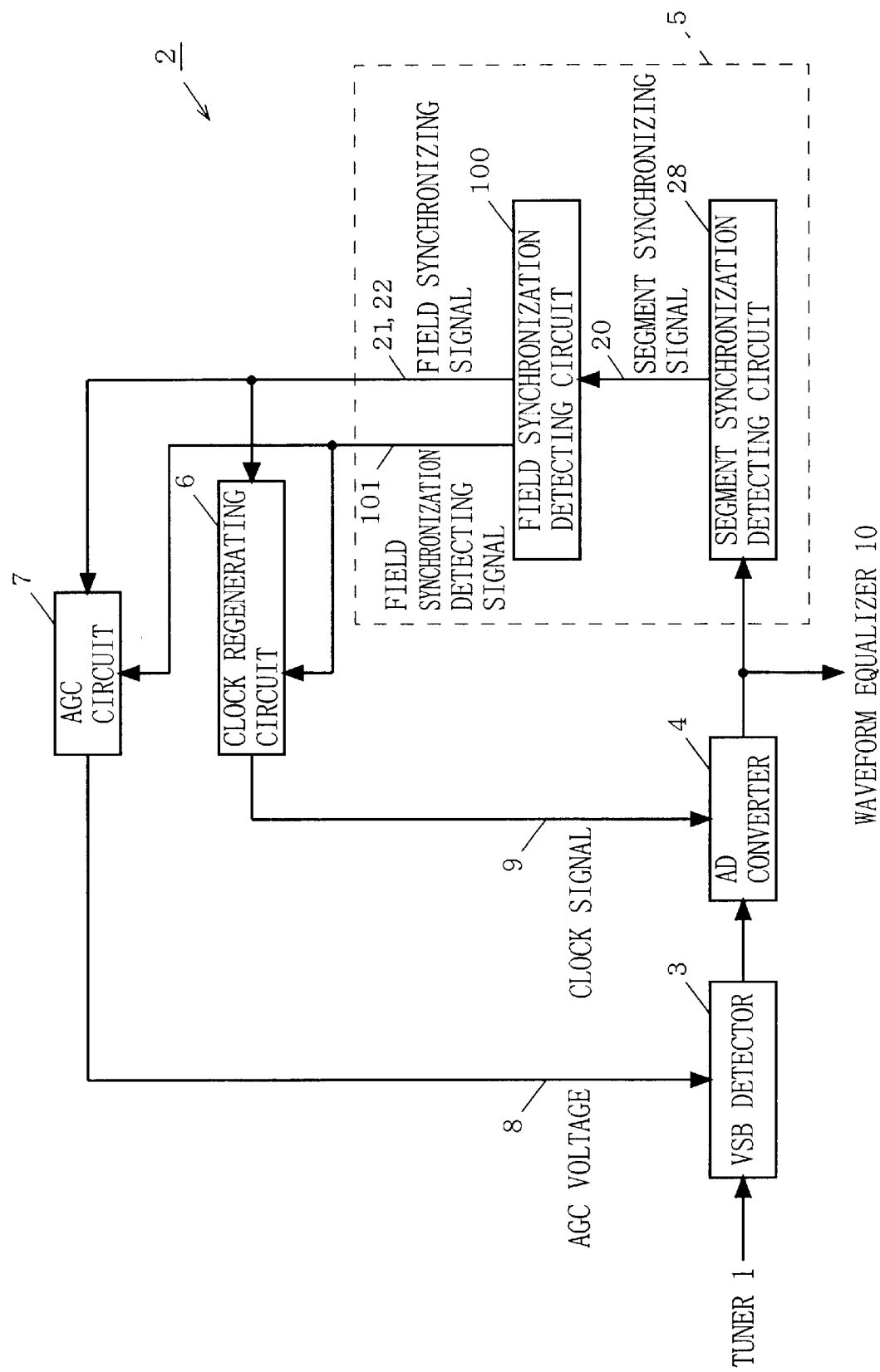
FIG. 18 is a block diagram showing the configuration of a digital demodulation portion 2 in a VSB receiver according to a thirteenth embodiment of the present invention.

FIG. 18 is a block diagram showing the configuration of a digital demodulation portion 2 in a VSB receiver according to a thirteenth embodiment of the present invention. In FIG. 18, the digital demodulation portion 2 in the thirteenth embodiment comprises a VSB detector 3, an AD converter 4, a segment synchronization detecting circuit 28, a field synchronization detecting circuit 100, a clock regenerating circuit 6, and an AGC circuit 7.

As shown in FIG. 18, in the digital demodulation portion 2 in the thirteenth embodiment, the synchronization detecting circuit 5 shown in FIG. 1 is constituted by the segment synchronization detecting circuit 28 and the field synchronization detecting circuit 100. In FIG. 18, the same constituent elements as those shown in FIG. 1 are assigned the same reference numerals and hence, the description thereof is not repeated. Any one of the configurations in the first to sixth embodiments is used for the AGC circuit 7 in FIG. 18. Any one of the configurations in the seventh to twelfth embodiments is used for the clock regenerating circuit 6 in FIG. 18.

The constituent elements in the digital demodulation portion 2 in the thirteenth embodiment will be successively described.

Digital data (FIG. 2) outputted by the AD converter 4 is inputted to a waveform equalizer 10 and the segment synchronization detecting circuit 28. The segment synchronization detecting circuit 28 subjects the inputted digital data to segment synchronization detection, and outputs a segment synchronizing signal 20 obtained by the detection to the field synchronization detecting circuit 100.

A segment synchronization detecting method which is carried out by the segment synchronization detecting circuit 28 was described in the first embodiment and hence, the detailed description thereof is not repeated.

The field synchronization detecting circuit 100 performs field synchronization detection on the basis of the inputted segment synchronizing signal 20, and outputs the field synchronizing signals 21 and 22 and the field synchronization detecting signal 101 which have been detected, respectively, to the clock regenerating circuit 6 and the AGC circuit 7.

Figure 19:
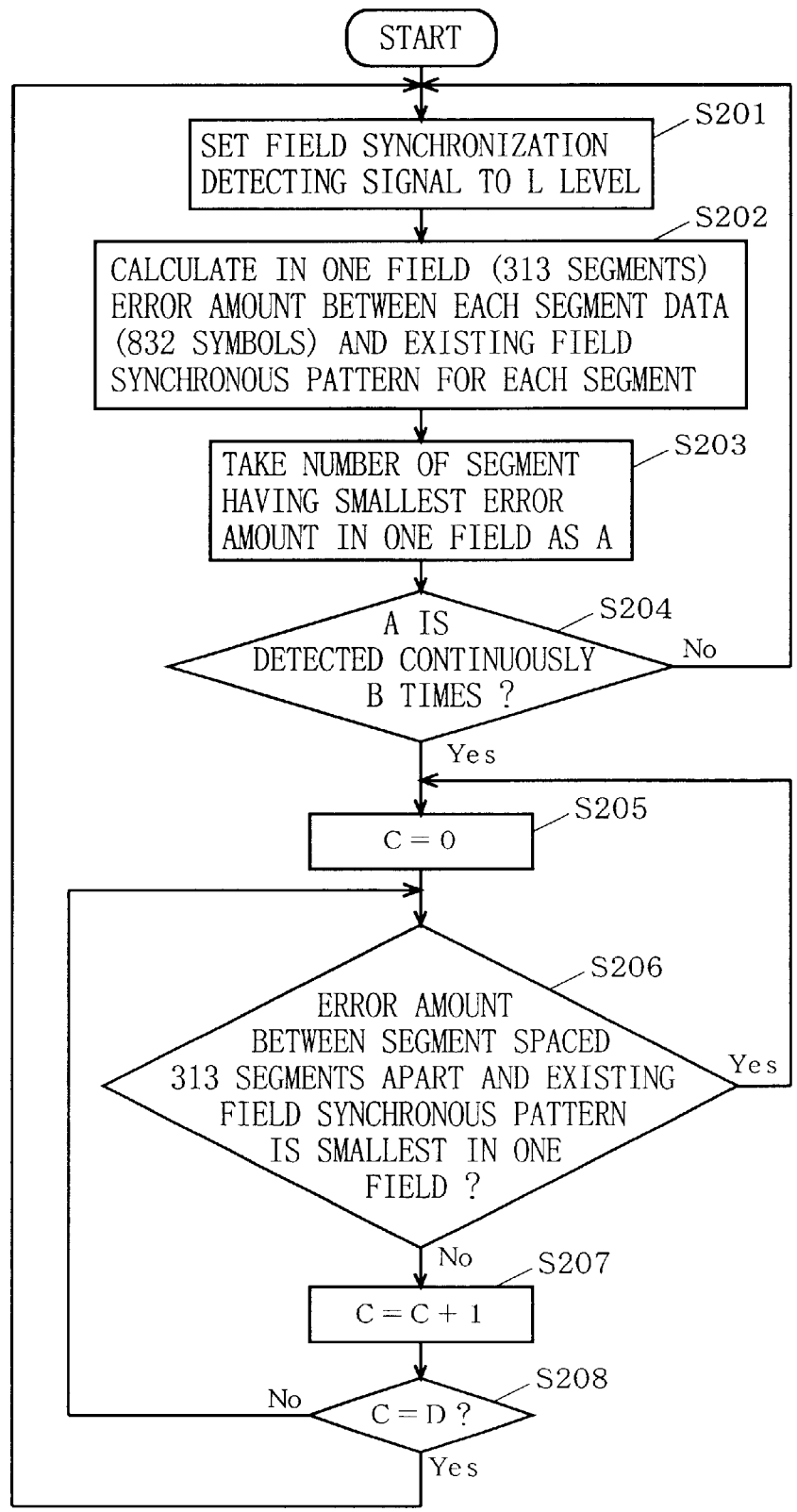
FIG. 19 is a flow chart showing the procedure for field synchronization detection performed by a field synchronization detecting circuit 100 shown in FIG. 18.
Figure 22:
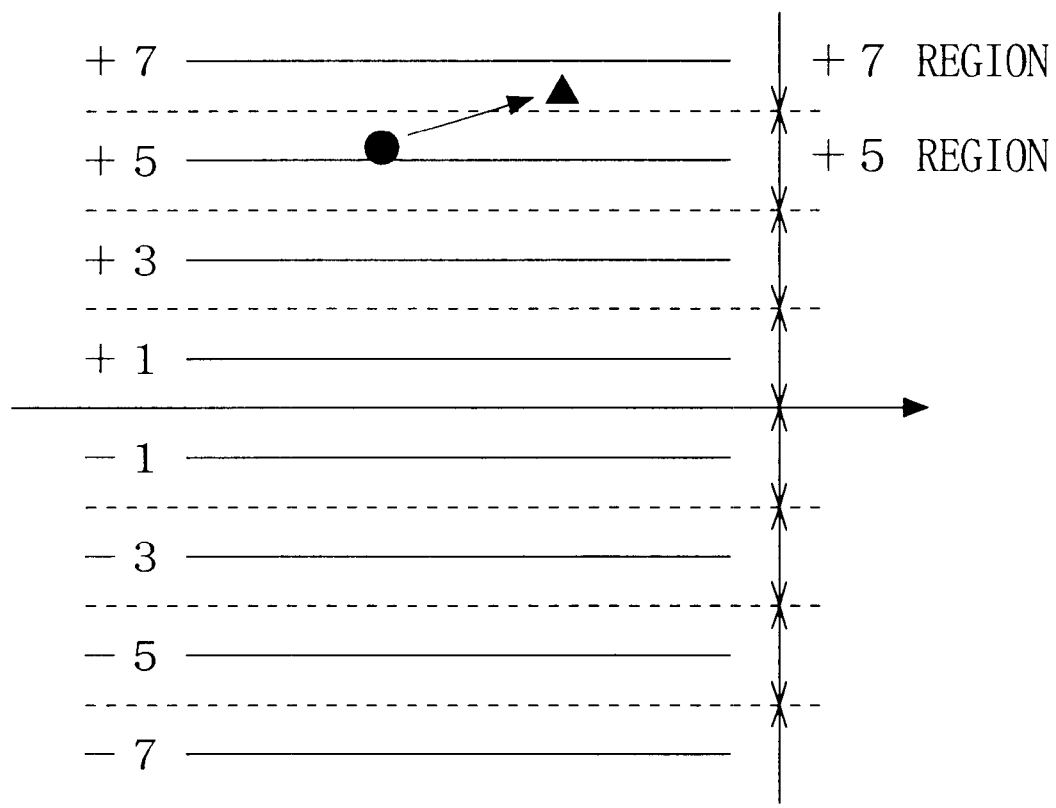
FIG. 22 is a diagram for explaining a problem which arises in a conventional VSB receiver.

A field synchronization detecting method which is carried out by the field synchronization detecting circuit 100 will be described while further referring to FIG. 19. FIG. 19 is a flow chart showing the procedure for the field synchronization detection which is performed by the field synchronization detecting circuit 100.

As shown in FIG. 3, it is previously found how data is sent as the field synchronizing signals 21 and 22. Accordingly, a head part of each of segments is found by detecting the segment synchronizing signal in transmitted data in the segment synchronization detecting circuit 28. Therefore, the field synchronization detecting circuit 100 detects the field synchronizing signals 21 and 22 on the basis of the position of the detected segment synchronizing signal 20 as described in the following.

The field synchronization detecting circuit 100 first initializes the field synchronization detecting signal 101 to a low level "L" when a field synchronization detecting operation is started (step S201). The field synchronization detecting circuit 100 then calculates in one field (313 segments) the sum of errors (an error amount) between 832 symbol data composing each of the segments and a particular pattern of the field synchronizing signals 21 and 22 for each segment (step S202). The field synchronization detecting circuit 100 takes the A-th segment, of which error amount in one field is the smallest, as a candidate for field synchronization (step S203). The field synchronization detecting circuit 100 then calculates the segment, of which error amount for each field is the smallest, and judges the number of times the calculated segment is continued to be the A-th segment (step S204). In the judgment at the step S204, the segment calculated for each field is continued B times (B is the number of times a field synchronous pattern has been detected which is to be determination that a field synchronizing signal has been detected, and is previously arbitrarily determined), to be the A-th segment, the field synchronization detecting circuit 100 determines the A-th segment as the field synchronizing signal 21 or 22. Thereafter, the program proceeds to the step S206. On the other hand, in the judgment at the step S204, when the segment calculated for each field is not continued B times, to be the A-th segment, the program is returned to the step S201. At the step S201, the field synchronization detecting circuit 100 performs processing for determining field synchronization detection again.

Furthermore, the field synchronization detecting circuit 100 judges, even after the field synchronization detection is determined, whether or not in each of the succeeding fields, an error amount of the segment spaced 313 segments apart from the segment which is determined to be the field synchronizing signal 21 or 22 is the smallest (step S206). In the judgment at the step S206, when the error amount of the segment spaced 313 segments apart is not the smallest, the field synchronization detecting circuit 100 increments the value of the number of times C a field synchronous pattern is not detected, which has been initialized at the step S205, by one (step S207). When the procedure at the steps S206 to S207 is repeated, so that C=D (D is the number of times a field synchronous pattern is not detected to be determination that a field synchronizing signal is not determined, and is previously arbitrarily determined), the field synchronization detecting circuit 100 judges that the field synchronization detection is changed from the state where it is determined to a state where it is not determined. The program is returned to the step S201. At the step S201, processing for determining field synchronization detection is performed again (step S208).

The field synchronizing signals 21, 22 and the field synchronization detecting signal 101 which have been detected in the field synchronization detecting circuit 100 by the above-mentioned processing are respectively outputted to the AGC circuit 7 and the clock regenerating circuit 6, which are described in the first to twelfth embodiments, in place of the segment synchronizing signal 20 and the segment synchronization detecting signal 30.

The AGC circuit 7 and the clock regenerating circuit 6 respectively constitute large or small loop gains on the basis of the field synchronizing signals 21 and 22, as described above, and suitably switch the large or small loop gains in accordance with the field synchronization detecting signal 101.

As described in the foregoing, according to the VSB receiver according to the thirteenth embodiment of the present invention, the band or the amplitude value is switched to a large value until the field synchronizing signals 21 and 22 are detected such that a time period required for the detection is shortened, while being switched to a small value in order to improve a ghost disturbance removal performance after the field synchronizing signal 21 or 22 is detected, to control the loop gains of the AGC circuit 7 and the clock regenerating circuit 6.

Even when there is a ghost disturbance in the received signal, therefore, it is possible to shorten the time periods required to detect the segment synchronizing signal 20 and the field synchronizing signals 21 and 22 as well as to improve the ghost disturbance removal performance. Further, no jitter occurs in a regenerated clock in the VSB receiver, so that no error occurs in the received signal.

Although in the thirteenth embodiment, description was made of a case where the loop gains of both the AGC circuit 7 and the clock regenerating circuit 6 are controlled using the field synchronizing signals 21 and 22 and the field synchronization detecting signal 101, the loop gain of only the AGC circuit 7 may be controlled.

INDUSTRIAL APPLICABILITY

As described in the foregoing, a VSB receiver according to the present invention can be employed, in receiving a terrestrial digital broadcasting signal which is subjected to multi-valued VSB modulation and is transmitted, for the purpose of making a reduction of a time period required until convergence processing in an AGC circuit and a clock regenerating circuit is completed compatible with an improvement of a ghost disturbance removal performance and accurate clock regeneration.

What is claimed is:

1. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation; and automatic gain control means whose loop gain is feedback-controlled through a gain detector, an amplifier, and a loop filter on the basis of said segment synchronizing signal detected by said segment synchronization detection means such that the level of said segment synchronizing signal is constant, said automatic gain control means switching said loop filter to a wide band until said segment synchronizing signal is detected, while switching said loop filter to a narrow band after it is detected in accordance with the segment synchronization detecting signal indicating the presence or absence of the detection of said segment synchronizing signal.

2. The VSB receiver according to claim 1, characterized in that said loop filter is a wide-band loop filter and a narrow-band loop filter, each of which is constituted by a resistor and a capacitor, and said automatic gain control means switches the value of a time constant determined by said resistor and said capacitor in accordance with said segment synchronization detecting signal, to control the bandwidth of said loop filter.

3. The VSB receiver according to claim 1, characterized in that said loop filter is a digital filter whose bandwidth can be varied in accordance with a filter coefficient separately given thereto, and said automatic gain control means switches the filter coefficient given to said digital filter in accordance with said segment synchronization detecting signal, to control the bandwidth of said loop filter.

4. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation; and automatic gain control means whose loop gain is feedback-controlled through a gain detector, an amplifier, and a loop filter on the basis of said segment synchronizing signal detected by said segment synchronization detection means such that the level of said segment synchronizing signal is constant, said automatic gain control means switching the gain of said amplifier to a large value until said segment synchronizing signal is detected, while switching the gain of said amplifier to a small value after it is detected in accordance with the segment synchronization detecting signal indicating the presence or absence of the detection of said segment synchronizing signal.

5. The VSB receiver according to claim 4, characterized in that said amplifier is constituted by a high-gain operational amplifier and a low-gain operational amplifier, and said automatic gain control means switches the amplifier to either one of said operational amplifiers in accordance with said segment synchronization detecting signal, to control the gain of said amplifier.

6. The VSB receiver according to claim 4, characterized in that said amplifier is a multiplier whose amplitude value can be varied in accordance with a coefficient separately given thereto, and said automatic gain control means switches the coefficient given to said multiplier in accordance with said segment synchronization detecting signal, to control the gain of said amplifier.

7. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation;

automatic gain control means whose loop gain is feedback-controlled through a gain detector, an amplifier, and a loop filter on the basis of said segment synchronizing signal detected by said segment synchronization detection means such that the level of said segment synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said segment synchronizing signal detected by said segment synchronization detection means, each of said automatic gain control means and said clock regeneration means switching said loop filter to a wide band until said segment synchronizing signal is detected, while switching said loop filter to a narrow band after it is detected in accordance with the segment synchronization detecting signal indicating the presence or absence of the detection of said segment synchronizing signal.

8. The VSB receiver according to claim 7, characterized in that said loop filter in each of said automatic gain control means and said clock regeneration means is a wide-band loop filter and a narrow-band loop filter, each of which is constituted by a resistor and a capacitor, and each of said automatic gain control means and said clock regeneration means switches the value of a time constant determined by said resistor and said capacitor in accordance with said segment synchronization detecting signal, to control the bandwidth of said loop filter.

9. The VSB receiver according to claim 7, characterized in that said loop filter in each of said automatic gain control means and said clock regeneration means is a digital filter whose bandwidth can be varied in accordance with a filter coefficient separately given thereto, and each of said automatic gain control means and said clock regeneration means switches the filter coefficient given to said digital filter in accordance with said segment synchronization detecting signal, to control the bandwidth of said loop filter.

10. The VSB receiver according to claim 7, characterized in that said loop filter in said automatic gain control means is a wide-band loop filter and a narrow-band loop filter, each of which is constituted by a resistor and a capacitor, and said loop filter in said clock regeneration means is a digital filter whose bandwidth can be varied in accordance with a filter coefficient separately given thereto, and said automatic gain control means switches the value of a time constant determined by said resistor and said capacitor in accordance with said segment synchronization detecting signal, and said clock regeneration means switches the filter coefficient given to said digital filter in accordance with said segment synchronization detecting signal, to respectively control the bandwidths of said loop filters.

11. The VSB receiver according to claim 7, characterized in that said loop filter in said automatic gain control means is a digital filter whose bandwidth can be varied in accordance with a filter coefficient separately given thereto, and said loop filter in said clock regeneration means is a wide-band loop filter and a narrow-band loop filter, each of which is constituted by a resistor and a capacitor, and said automatic gain control means switches the filter coefficient given to said digital filter in accordance with said segment synchronization detecting signal, and said clock regeneration means switches the value of a time constant determined by said resistor and said capacitor in accordance with said segment synchronization detecting signal, to respectively control the bandwidths of said loop filters.

12. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation;

automatic gain control means whose loop gain is feedback-controlled through a gain detector, an amplifier, and a loop filter on the basis of said segment synchronizing signal detected by said segment synchronization detection means such that the level of said segment synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said segment synchronizing signal detected by said segment synchronization detection means, each of said automatic gain control means and said clock regeneration means switching the gain of said amplifier to a large value until said segment synchronizing signal is detected, while switching the gain of said amplifier to a small value after it is detected in accordance with the segment synchronization detecting signal indicating the presence or absence of the detection of said segment synchronizing signal.

13. The VSB receiver according to claim 12, characterized in that said amplifier in each of said automatic gain control means and said clock regeneration means is constituted by a high-gain operational amplifier and a low-gain operational amplifier, and each of said automatic gain control means and said clock regeneration means switches the amplifier to either one of said operational amplifiers in accordance with said segment synchronization detecting signal, to control the gain of said amplifier.

14. The VSB receiver according to claim 12, characterized in that said amplifier in each of said automatic gain control means and said clock regeneration means is a multiplier whose amplitude value can be varied in accordance with a coefficient separately given thereto, and each of said automatic gain control means and said clock regeneration means switches the coefficient given to said multiplier in accordance with said segment synchronization detecting signal, to control the gain of said amplifier.

15. The VSB receiver according to claim 12, characterized in that said amplifier in said automatic gain control means is constituted by a high-gain operational amplifier and a low-gain operational amplifier, and said amplifier in said clock regeneration means is a multiplier whose amplitude value can be varied in accordance with a coefficient separately given thereto, and said automatic gain control means switches the amplifier to either one of said operational amplifiers in accordance with said segment synchronization detecting signal, and said clock regeneration means switches the coefficient given to said multiplier in accordance with said segment synchronization detecting signal, to respectively control the gains of said amplifiers.

16. The VSB receiver according to claim 12, characterized in that said amplifier in said automatic gain control means is a multiplier whose amplitude value can be varied in accordance with a coefficient separately given thereto, and said amplifier in said clock regeneration means is constituted by a high-gain operational amplifier and a low-gain operational amplifier, and said automatic gain control means switches the coefficient given to said multiplier in accordance with said segment synchronization detecting signal, and said clock regeneration means switches the amplifier to either one of said operational amplifiers in accordance with said segment synchronization detecting signal, to respectively control the gains of said amplifiers.

17. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation;

automatic gain control means whose loop gain is feedback-controlled through a gain detector, an amplifier, and a loop filter on the basis of said segment synchronizing signal detected by said segment synchronization detection means such that the level of said segment synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said segment synchronizing signal detected by said segment synchronization detection means, said automatic gain control means switching said loop filter to a wide band until said segment synchronizing signal is detected, while switching said loop filter to a narrow band after it is detected in accordance with the segment synchronization detecting signal indicating the presence or absence of the detection of said segment synchronizing signal, and said clock regeneration means switching the gain of said amplifier to a large value until said segment synchronizing signal is detected, while switching the gain of said amplifier to a small value after it is detected in accordance with said segment synchronization detecting signal.

18. The VSB receiver according to claim 17, characterized in that said loop filter in said automatic gain control means is a wide-band loop filter and a narrow-band loop filter, each of which is constituted by a resistor and a capacitor, and said amplifier in said clock regeneration means is constituted by a high-gain operational amplifier and a low-gain operational amplifier, and said automatic gain control means switches the value of a time constant determined by said resistor and said capacitor in accordance with said segment synchronization detecting signal, to control the bandwidth of said loop filter, and said clock regeneration means switches the amplifier to either one of said operational amplifiers in accordance with said segment synchronization detecting signal, to control the gain of said amplifier.

19. The VSB receiver according to claim 17, characterized in that said loop filter in said automatic gain control means is a wide-band loop filter and a narrow-band loop filter, each of which is constituted by a resistor and a capacitor, and said amplifier in said clock regeneration means is a multiplier whose amplitude value can be varied in accordance with a coefficient separately given thereto, and said automatic gain control means switches the value of a time constant determined by said resistor and said capacitor in accordance with said segment synchronization detecting signal, to control the bandwidth of said loop filter, and said clock regeneration means switches the coefficient given to said multiplier in accordance with said segment synchronization detecting signal, to control the gain of said amplifier.

20. The VSB receiver according to claim 17, characterized in that said loop filter in said automatic gain control means is a digital filter whose bandwidth can be varied in accordance with a filter coefficient separately given thereto, and said amplifier in said clock regeneration means is constituted by a high-gain operational amplifier and a low-gain operational amplifier, and said automatic gain control means switches the filter coefficient given to said digital filter in accordance with said segment synchronization detecting signal, to control the bandwidth of said loop filter, and said clock regeneration means switches the amplifier to either one of said operational amplifiers in accordance with said segment synchronization detecting signal, to control the gain of said amplifier.

21. The VSB receiver according to claim 17, characterized in that said loop filter in said automatic gain control means is a digital filter whose bandwidth can be varied in accordance with a filter coefficient separately given thereto, and said amplifier in said clock regeneration means is a multiplier whose amplitude value can be varied in accordance with a coefficient separately given thereto, and said automatic gain control means switches the filter coefficient given to said digital filter in accordance with said segment synchronization detecting signal, to control the bandwidth of said loop filter, and said clock regeneration means switches the coefficient given to said multiplier in accordance with said segment synchronization detecting signal, to control the gain of said amplifier.

22. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

segment synchronization detection means for detecting said segment synchronizing signal from the received signal which has been subjected to said multi-valued VSB modulation;

automatic gain control means whose loop gain is feedback-controlled through a gain detector, an amplifier, and a loop filter on the basis of said segment synchronizing signal detected by said segment synchronization detection means such that the level of said segment synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said segment synchronizing signal detected by said segment synchronization detection means, said automatic gain control means switching the gain of said amplifier to a large value until said segment synchronizing signal is detected, while switching the gain of said amplifier to a small value after it is detected in accordance with the segment synchronization detecting signal indicating the presence or absence of the detection of said segment synchronizing signal, and said clock regeneration means switching said loop filter to a wide band until said segment synchronizing signal is detected, while switching said loop filter to a narrow band after it is detected in accordance with said segment synchronization detecting signal.

23. The VSB receiver according to claim 22, characterized in that said amplifier in said automatic gain control means is constituted by a high-gain operational amplifier and a low-gain operational amplifier, and said loop filter in said clock regeneration means is a wide-band loop filter and a narrow-band loop filter, each of which is constituted by a resistor and a capacitor, and said automatic gain control means switches the amplifier to either one of said operational amplifiers in accordance with said segment synchronization detecting signal, to control the gain of said amplifier, and said clock regeneration means switches the value of a time constant determined by said resistor and said capacitor in accordance with said segment synchronization detecting signal, to control the bandwidth of said loop filter.

24. The VSB receiver according to claim 22, characterized in that said amplifier in said automatic gain control means is constituted by a high-gain operational amplifier and a low-gain operational amplifier, and said loop filter in said clock regeneration means is a digital filter whose bandwidth can be varied in accordance with a filter coefficient separately given thereto, and said automatic gain control means switches the amplifier to either one of said operational amplifiers in accordance with said segment synchronization detecting signal, to control the gain of said amplifier, and said clock regeneration means switches the filter coefficient given to said digital filter in accordance with said segment synchronization detecting signal, to control the bandwidth of said loop filter.

25. The VSB receiver according to claim 22, characterized in that said amplifier in said automatic gain control means is a multiplier whose amplitude value can be varied in accordance with a coefficient separately given thereto, and said loop filter in said clock regeneration means is a wide-band loop filter and a narrow-band loop filter, each of which is constituted by a resistor and a capacitor, and said automatic gain control means switches the coefficient given to said multiplier in accordance with said segment synchronization detecting signal, to control the gain of said amplifier, and said clock regeneration means switches the value of a time constant determined by said resistor and said capacitor in accordance with said segment synchronization detecting signal, to control the bandwidth of said loop filter.

26. The VSB receiver according to claim 22, characterized in that said amplifier in said automatic gain control means is a multiplier whose amplitude value can be varied in accordance with a coefficient separately given thereto, and said loop filter in said clock regeneration means is a digital filter whose bandwidth can be varied in accordance with a filter coefficient separately given thereto, and said automatic gain control means switches the coefficient given to said multiplier in accordance with said segment synchronization detecting signal, to control the gain of said amplifier, and said clock regeneration means switches the filter coefficient given to said digital filter in accordance with said segment synchronization detecting signal, to control the bandwidth of said loop filter.

27. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation; and automatic gain control means whose loop gain is feedback-controlled through a gain detector, an amplifier, and a loop filter on the basis of said field synchronizing signal detected by said field synchronization detection means such that the level of said field synchronizing signal is constant, said automatic gain control means switching said loop filter to a wide band until said field synchronizing signal is detected, while switching said loop filter to a narrow band after it is detected in accordance with the field synchronization detecting signal indicating the presence or absence of the detection of said field synchronizing signal.

28. The VSB receiver according to claim 27, characterized in that said loop filter is a wide-band loop filter and a narrow-band loop filter, each of which is constituted by a resistor and a capacitor, and said automatic gain control means switches the value of a time constant determined by said resistor and said capacitor in accordance with said field synchronization detecting signal, to control the bandwidth of said loop filter.

29. The VSB receiver according to claim 27, characterized in that said loop filter is a digital filter whose bandwidth can be varied in accordance with a filter coefficient separately given thereto, and said automatic gain control means switches the filter coefficient given to said digital filter in accordance with said field synchronization detecting signal, to control the bandwidth of said loop filter.

30. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation; and automatic gain control means whose loop gain is feedback-controlled through a gain detector, an amplifier, and a loop filter on the basis of said field synchronizing signal detected by said field synchronization detection means such that the level of said field synchronizing signal is constant, said automatic gain control means switching the gain of said amplifier to a large value until said field synchronizing signal is detected, while switching the gain of said amplifier to a small value after it is detected in accordance with the field synchronization detecting signal indicating the presence or absence of the detection of said field synchronizing signal.

31. The VSB receiver according to claim 30, characterized in that said amplifier is constituted by a high-gain operational amplifier and a low-gain operational amplifier, and said automatic gain control means switches the amplifier to either one of said operational amplifiers in accordance with said field synchronization detecting signal, to control the gain of said amplifier.

32. The VSB receiver according to claim 30, characterized in that said amplifier is a multiplier whose amplitude value can be varied in accordance with a coefficient separately given thereto, and said automatic gain control means switches the coefficient given to said multiplier in accordance with said field synchronization detecting signal, to control the gain of said amplifier.

33. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation;

automatic gain control means whose loop gain is feedback-controlled through a gain detector, an amplifier, and a loop filter on the basis of said field synchronizing signal detected by said field synchronization detection means such that the level of said field synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said field synchronizing signal detected by said field synchronization detection means, each of said automatic gain control means and said clock regeneration means switching said loop filter to a wide band until said field synchronizing signal is detected, while switching said loop filter to a narrow band after it is detected in accordance with the field synchronization detecting signal indicating the presence or absence of the detection of said field synchronizing signal.

34. The VSB receiver according to claim 33, characterized in that said loop filter in each of said automatic gain control means and said clock regeneration means is a wide-band loop filter and a narrow-band loop filter, each of which is constituted by a resistor and a capacitor, and each of said automatic gain control means and said clock regeneration means switches the value of a time constant determined by said resistor and said capacitor in accordance with said field synchronization detecting signal, to control the bandwidth of said loop filter.

35. The VSB receiver according to claim 33, characterized in that said loop filter in each of said automatic gain control means and said clock regeneration means is a digital filter whose bandwidth can be varied in accordance with a filter coefficient separately given thereto, and each of said automatic gain control means and said clock regeneration means switches the filter coefficient given to said digital filter in accordance with said field synchronization detecting signal, to control the bandwidth of said loop filter.

36. The VSB receiver according to claim 33, characterized in that said loop filter in said automatic gain control means is a wide-band loop filter and a narrow-band loop filter, each of which is constituted by a resistor and a capacitor, and said loop filter in said clock regeneration means is a digital filter whose bandwidth can be varied in accordance with a filter coefficient separately given thereto, and said automatic gain control means switches the value of a time constant determined by said resistor and said capacitor in accordance with said field synchronization detecting signal, and said clock regeneration means switches the filter coefficient given to said digital filter in accordance with said field synchronization detecting signal, to respectively control the bandwidths of said loop filters.

37. The VSB receiver according to claim 33, characterized in that said loop filter in said automatic gain control means is a digital filter whose bandwidth can be varied in accordance with a filter coefficient separately given thereto, and said loop filter in said clock regeneration means is a wide-band loop filter and a narrow-band loop filter, each of which is constituted by a resistor and a capacitor, and said automatic gain control means switches the filter coefficient given to said digital filter in accordance with said field synchronization detecting signal, and said clock regeneration means switches the value of a time constant determined by said resistor and said capacitor in accordance with said field synchronization detecting signal, to respectively control the bandwidths of said loop filters.

38. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation;

automatic gain control means whose loop gain is feedback-controlled through a gain detector, an amplifier, and a loop filter on the basis of said field synchronizing signal detected by said field synchronization detection means such that the level of said field synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said field synchronizing signal detected by said field synchronization detection means, each of said automatic gain control means and said clock regeneration means switching the gain of said amplifier to a large value until said field synchronizing signal is detected, while switching the gain of said amplifier to a small value after it is detected in accordance with the field synchronization detecting signal indicating the presence or absence of the detection of said field synchronizing signal.

39. The VSB receiver according to claim 38, characterized in that said amplifier in each of said automatic gain control means and said clock regeneration means is constituted by a high-gain operational amplifier and a low-gain operational amplifier, and each of said automatic gain control means and said clock regeneration means switches the amplifier to either one of said operational amplifiers in accordance with said field synchronization detecting signal, to control the gain of said amplifier.

40. The VSB receiver according to claim 38, characterized in that said amplifier in each of said automatic gain control means and said clock regeneration means is a multiplier whose amplitude value can be varied in accordance with a coefficient separately given thereto, and each of said automatic gain control means and said clock regeneration means switches the coefficient given to said multiplier in accordance with said field synchronization detecting signal, to control the gain of said amplifier.

41. The VSB receiver according to claim 38, characterized in that said amplifier in said automatic gain control means is constituted by a high-gain operational amplifier and a low-gain operational amplifier, and said amplifier in said clock regeneration means is a multiplier whose amplitude value can be varied in accordance with a coefficient separately given thereto, and said automatic gain control means switches the amplifier to either one of said operational amplifiers in accordance with said field synchronization detecting signal, and said clock regeneration means switches the coefficient given to said multiplier in accordance with said field synchronization detecting signal, to respectively control the gains of said amplifiers.

42. The VSB receiver according to claim 38, characterized in that said amplifier in said automatic gain control means is a multiplier whose amplitude value can be varied in accordance with a coefficient separately given thereto, and said amplifier in said clock regeneration means is constituted by a high-gain operational amplifier and a low-gain operational amplifier, and said automatic gain control means switches the coefficient given to said multiplier in accordance with said field synchronization detecting signal, and said clock regeneration means switches the amplifier to either one of said operational amplifiers in accordance with said field synchronization detecting signal, to respectively control the gains of said amplifiers.

43. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation;

automatic gain control means whose loop gain is feedback-controlled through a gain detector, an amplifier, and a loop filter on the basis of said field synchronizing signal detected by said field synchronization detection means such that the level of said field synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said field synchronizing signal detected by said field synchronization detection means, said automatic gain control means switching said loop filter to a wide band until said field synchronizing signal is detected, while switching said loop filter to a narrow band after it is detected in accordance with the field synchronization detecting signal indicating the presence or absence of the detection of said field synchronizing signal, and said clock regeneration means switching the gain of said amplifier to a large value until said field synchronizing signal is detected, while switching the gain of said amplifier to a small value after it is detected in accordance with said field synchronization detecting signal.

44. The VSB receiver according to claim 43, characterized in that said loop filter in said automatic gain control means is a wide-band loop filter and a narrow-band loop filter, each of which is constituted by a resistor and a capacitor, and said amplifier in said clock regeneration means is constituted by a high-gain operational amplifier and a low-gain operational amplifier, and said automatic gain control means switches the value of a time constant determined by said resistor and said capacitor in accordance with said field synchronization detecting signal, to control the bandwidth of said loop filter, and said clock regeneration means switches the amplifier to either one of said operational amplifiers in accordance with said field synchronization detecting signal, to control the gain of said amplifier.

45. The VSB receiver according to claim 43, characterized in that said loop filter in said automatic gain control means is a wide-band loop filter and a narrow-band loop filter, each of which is constituted by a resistor and a capacitor, and said amplifier in said clock regeneration means is a multiplier whose amplitude value can be varied in accordance with a coefficient separately given thereto, and said automatic gain control means switches the value of a time constant determined by said resistor and said capacitor in accordance with said field synchronization detecting signal, to control the bandwidth of said loop filter, and said clock regeneration means switches the coefficient given to said multiplier in accordance with said field synchronization detecting signal, to control the gain of said amplifier.

46. The VSB receiver according to claim 43, characterized in that said loop filter in said automatic gain control means is a digital filter whose bandwidth can be varied in accordance with a filter coefficient separately given thereto, and said amplifier in said clock regeneration means is constituted by a high-gain operational amplifier and a low-gain operational amplifier, and said automatic gain control means switches the filter coefficient given to said digital filter in accordance with said field synchronization detecting signal, to control the bandwidth of said loop filter, and said clock regeneration means switches the amplifier to either one of said operational amplifiers in accordance with said field synchronization detecting signal, to control the gain of said amplifier.

47. The VSB receiver according to claim 43, characterized in that said loop filter in said automatic gain control means is a digital filter whose bandwidth can be varied in accordance with a filter coefficient separately given thereto, and said amplifier in said clock regeneration means is a multiplier whose amplitude value can be varied in accordance with a coefficient separately given thereto, and said automatic gain control means switches the filter coefficient given to said digital filter in accordance with said field synchronization detecting signal, to control the bandwidth of said loop filter, and said clock regeneration means switches the coefficient given to said multiplier in accordance with said field synchronization detecting signal, to control the gain of said amplifier.

48. A VSB receiver for receiving a terrestrial digital broadcasting signal obtained by subjecting video and audio data constructed in a format having a segment synchronizing signal at the head of each of segments and a field synchronizing signal at the head of each of fields to multi-valued VSB (octal or hexadecimal VSB) modulation and transmitted, characterized by comprising:

field synchronization detection means for detecting said field synchronizing signal from the received signal which has been subjected to said multi-valued VSB modulation;

automatic gain control means whose loop gain is feedback-controlled through a gain detector, an amplifier, and a loop filter on the basis of said field synchronizing signal detected by said field synchronization detection means such that the level of said field synchronizing signal is constant; and clock regeneration means whose loop gain is feedback-controlled through a clock frequency detector, an amplifier, a loop filter, and a variable clock oscillator such that a clock frequency to be regenerated coincides with the clock frequency of the received signal on the basis of said field synchronizing signal detected by said field synchronization detection means, said automatic gain control means switching the gain of said amplifier to a large value until said field synchronizing signal is detected, while switching the gain of said amplifier to a small value after it is detected in accordance with the field synchronization detecting signal indicating the presence or absence of the detection of said field synchronizing signal, and said clock regeneration means switching said loop filter to a wide band until said field synchronizing signal is detected, while switching said loop filter to a narrow band after it is detected in accordance with said field synchronization detecting signal.

49. The VSB receiver according to claim 48, characterized in that said amplifier in said automatic gain control means is constituted by a high-gain operational amplifier and a low-gain operational amplifier, and said loop filter in said clock regeneration means is a wide-band loop filter and a narrow-band loop filter, each of which is constituted by a resistor and a capacitor, and said automatic gain control means switches the amplifier to either one of said operational amplifiers in accordance with said field synchronization detecting signal, to control the gain of said amplifier, and said clock regeneration means switches the value of a time constant determined by said resistor and said capacitor in accordance with said field synchronization detecting signal, to control the bandwidth of said loop filter.

50. The VSB receiver according to claim 48, characterized in that said amplifier in said automatic gain control means is constituted by a high-gain operational amplifier and a low-gain operational amplifier, and said loop filter in said clock regeneration means is a digital filter whose bandwidth can be varied in accordance with a filter coefficient separately given thereto, and said automatic gain control means switches the amplifier to either one of said operational amplifiers in accordance with said field synchronization detecting signal, to control the gain of said amplifier, and said clock regeneration means switches the filter coefficient given to said digital filter in accordance with said field synchronization detecting signal, to control the bandwidth of said loop filter.

51. The VSB receiver according to claim 48, characterized in that said amplifier in said automatic gain control means is a multiplier whose amplitude value can be varied in accordance with a coefficient separately given thereto, and said loop filter in said clock regeneration means is a wide-band loop filter and a narrow-band loop filter, each of which is constituted by a resistor and a capacitor, and said automatic gain control means switches the coefficient given to said multiplier in accordance with said field synchronization detecting signal, to control the gain of said amplifier, and said clock regeneration means switches the value of a time constant determined by said resistor and said capacitor in accordance with said field synchronization detecting signal, to control the bandwidth of said loop filter.

52. The VSB receiver according to claim 48, characterized in that said amplifier in said automatic gain control means is a multiplier whose amplitude value can be varied in accordance with a coefficient separately given thereto, and said loop filter in said clock regeneration means is a digital filter whose bandwidth can be varied in accordance with a filter coefficient separately given thereto, and said automatic gain control means switches the coefficient given to said multiplier in accordance with said field synchronization detecting signal, to control the gain of said amplifier, and said clock regeneration means switches the filter coefficient given to said digital filter in accordance with said field synchronization detecting signal, to control the bandwidth of said loop filter.

* * * * *